USO09312451B2

(12) United States Patent
Reed et al.

(10) Patent No.: US 9,312,451 B2
(45) Date of Patent: Apr. 12, 2016

(54) APPARATUS, METHOD TO ENHANCE COLOR CONTRAST IN PHOSPHOR-BASED SOLID STATE LIGHTS

(75) Inventors: William G. Reed, Seattle, WA (US); John O. Renn, Lake Forest Park, WA (US)

(73) Assignee: EXPRESS IMAGING SYSTEMS, LLC, Seattle, WA (US)

( * ) Notice: Subject to any disclaimer, the term of this patent is extended or adjusted under 35 U.S.C. 154(b) by 607 days.

(21) Appl. No.: 13/619,085

(22) Filed: Sep. 14, 2012

(65) Prior Publication Data

US 2013/0062637 A1    Mar. 14, 2013

Related U.S. Application Data

(60) Provisional application No. 61/534,722, filed on Sep. 14, 2011.

(51) Int. Cl.
*H01J 61/40*   (2006.01)
*H01L 33/44*   (2010.01)
*H01L 33/50*   (2010.01)
*G02B 5/28*    (2006.01)

(52) U.S. Cl.
CPC ............... *H01L 33/44* (2013.01); *H01L 33/50* (2013.01); *G02B 5/286* (2013.01); *G02B 5/289* (2013.01)

(58) Field of Classification Search
CPC ........ H01L 33/44; H01L 33/50; G02B 5/286; G02B 5/289; H05B 33/145
See application file for complete search history.

(56) References Cited

U.S. PATENT DOCUMENTS

| 6,746,274 B1 | 6/2004 | Verfuerth |
| 7,638,743 B2 | 12/2009 | Bartol et al. |
| 8,344,665 B2 | 1/2013 | Verfuerth et al. |
| 8,406,937 B2 | 3/2013 | Verfuerth et al. |
| 8,445,826 B2 | 5/2013 | Verfuerth |
| 8,450,670 B2 | 5/2013 | Verfuerth et al. |
| 8,476,565 B2 | 7/2013 | Verfuerth |
| 8,586,902 B2 | 11/2013 | Verfuerth |
| 8,604,701 B2 | 12/2013 | Verfuerth et al. |
| 8,637,877 B2 | 1/2014 | Negley |
| 8,666,559 B2 | 3/2014 | Verfuerth et al. |

(Continued)

FOREIGN PATENT DOCUMENTS

| EP | 2 068 193 A2 | 6/2009 |
| JP | 11-45519 A | 2/1999 |

(Continued)

OTHER PUBLICATIONS

English Machine Translation of JP 2008010518, Citizen Fine Tech, Yoshihisa.*

(Continued)

*Primary Examiner* — Andrew Coughlin
(74) *Attorney, Agent, or Firm* — Seed IP Law Group PLLC

(57) ABSTRACT

The efficiency and color contrast of a lighting device may be improved by using wavelength shifting material, such as a phosphor, to absorb less desired wavelengths and transmit more desired wavelengths. A double-notch reflective filter may pass desired wavelengths such as red and green, while returning or reflecting less desired wavelengths (blue and yellow) away from an optical exit back toward wavelength shifting material and re-emitted as light of more desirable wavelengths.

33 Claims, 14 Drawing Sheets

(56) References Cited

U.S. PATENT DOCUMENTS

| | | | |
|---|---|---|---|
| 8,779,340 | B2 | 7/2014 | Verfuerth et al. |
| 8,866,582 | B2 | 10/2014 | Verfuerth et al. |
| 8,884,203 | B2 | 11/2014 | Verfuerth et al. |
| 2005/0184638 | A1* | 8/2005 | Mueller et al. ............ 313/485 |
| 2006/0145172 | A1 | 7/2006 | Su et al. |
| 2007/0285000 | A1 | 12/2007 | Lim et al. |
| 2008/0284316 | A1 | 11/2008 | Kurihara et al. |
| 2009/0101930 | A1 | 4/2009 | Li |
| 2010/0149483 | A1 | 6/2010 | Chiavetta, III |
| 2010/0149814 | A1 | 6/2010 | Zhai et al. |
| 2010/0259924 | A1 | 10/2010 | Dong |
| 2011/0175518 | A1 | 7/2011 | Reed et al. |
| 2012/0038490 | A1 | 2/2012 | Verfuerth |
| 2012/0209755 | A1 | 8/2012 | Verfuerth et al. |
| 2012/0224363 | A1 | 9/2012 | Van De Ven |
| 2012/0274908 | A1* | 11/2012 | Ma ................... G02B 6/262 353/31 |
| 2013/0033183 | A1 | 2/2013 | Verfuerth et al. |
| 2013/0131882 | A1 | 5/2013 | Verfuerth et al. |
| 2014/0078308 | A1 | 3/2014 | Verfuerth |
| 2014/0097759 | A1 | 4/2014 | Verfuerth et al. |
| 2014/0180491 | A1 | 6/2014 | Verfuerth et al. |

FOREIGN PATENT DOCUMENTS

| | | | |
|---|---|---|---|
| JP | 2004-193580 | A | 7/2004 |
| JP | 2004-193581 | | 7/2004 |
| JP | 2008-010518 | A | 1/2008 |
| JP | 2009-71254 | A | 4/2009 |
| JP | 2009-105379 | A | 5/2009 |
| JP | 2009-251511 | A | 10/2009 |
| JP | 2010-250259 | A | 11/2010 |
| JP | 2011-501362 | A | 1/2011 |
| JP | 2011-528490 | A | 11/2011 |
| WO | 2004/068182 | A2 | 8/2004 |
| WO | 2009/052093 | A1 | 4/2009 |
| WO | 2009/107052 | A1 | 9/2009 |

OTHER PUBLICATIONS

Extended European Search Report, dated Sep. 3, 2014, for corresponding European Application No. 11733467.2, 5 pages.
Japanese Office Action, dated Sep. 9, 2014, for corresponding Japanese Application No. 2012-549127, 7 pages.
Extended European Search Report, dated Feb. 17, 2015, for corresponding European Application No. 12832462.1, 8 pages.
"File:Jul. 24, 2007 High-power light emiting diodes (Luxeon, Lumiled).jpg," retrieved from http://en.wikipedia.org/wiki/File:2007-07-24_High-power_light_emiting_diodes_(Luxeon,_Lumiled).jpg, download date: Oct. 18, 2010, 5 pages.
"File:LED, 5mm, green (en).svg," retrieved from http://en.wikipedia.org/wiki/File:LED_Labelled.svg, download date: Oct. 18, 2010, 4 pages.
International Search Report, dated Sep. 30, 2011, for International Application No. PCT/US2011/021359, 3 pages.
International Search Report, dated Jan. 2, 2013, for International Application No. PCT/US2012/055379, 3 pages.
"Light-emitting diode," retrieved from http://en.wikipedia.org/wiki/Light-emitting_diode, download date: Oct. 18, 2010, 27 pages.
Reed et al., "Apparatus, Method to Change Light Source Color Temperature With Reduced Optical Filter Losses," U.S. Appl. No. 13/007,080, Notice of Allowance, dated Oct. 15, 2012, 12 pages.
"Silicon Photonics: LED on SOI substrates," retrieved from http://www.pv.unsw.edu.au/research/siliconphotonics_LED.asp, download date: Oct. 18, 2010, 2 pages.
Written Opinion, dated Sep. 30, 2011, for International Application No. PCT/US2011/021359, 4 pages.
Written Opinion, dated Jan. 2, 2013, for International Application No. PCT/US2012/055379, 5 pages.
Communication pursuant to Article 94(3) EPC, dated Jun. 3, 2015, for corresponding European Application No. 11 733 467.2-1755, 12 pages.
Japanese Office Action, mailed Apr. 7, 2015, for corresponding Japanese Application No. 2012-549127, with English Translation, 7 pages.

* cited by examiner

US 9,312,451 B2

APPARATUS, METHOD TO ENHANCE COLOR CONTRAST IN PHOSPHOR-BASED SOLID STATE LIGHTS

CROSS-REFERENCE TO RELATED APPLICATION

This application claims the benefit under 35 U.S.C. §119 (e) of U.S. Provisional Patent Application No. 61/534,722 filed Sep. 14, 2011, which is incorporated herein by reference in its entirety.

BACKGROUND

1. Field

This disclosure generally relates to lighting devices that employ active light sources, in particular, phosphor-based solid state lights.

2. Description of the Related Art

Lighting devices exist in a broad range of designs suitable for various uses. Some lighting devices illuminate interior spaces, while others illuminate exterior spaces. Some lighting devices are used to provide information, for example, forming part of or all of a display panel. Active lighting sources take a variety of forms, for example incandescent lamps, high-intensity discharge (HID) lamps (e.g., mercury vapor lamps, high-pressure sodium lamps, metal halide lamps), and solid-state light sources for instance light emitting diodes (LEDs).

Lighting devices have a number of defining characteristics, including intensity (e.g., lumens), focus or dispersion, and temperature of the emitted light. For light sources that emit light by thermal radiation (e.g., incandescent filament), the color temperature (CT) of the light source is the temperature of an ideal black-body radiator that radiates light of comparable hue to that of the light source. Light sources that emit light by processes other than thermal radiation (e.g., solid state light sources) do not follow the form of a black-body spectrum. These light sources are assigned various correlated color temperatures (CCT) to indicate, to human color perception, the color temperature that most closely matches the light emitted.

Achieving desired lighting typically requires selecting suitable light sources, lenses, reflectors and/or housings based at least in part on the defining characteristics, the environment in which the lighting device will be used, and the desired level of performance.

LEDs are becoming increasingly popular due to their high energy efficiency, robustness, and long life performance. Typically, practical LEDs are capable of emitting light in a relatively narrow band. Since white light is often desirable, solid-state lighting systems typically employ "white" LEDs. These "white" LEDs may be manufactured by placing a phosphor layer either directly on a blue emitting LED die or onto a lens or window through which an LED will emit light. The phosphor layer is typically designed to convert radiation in the 440 to 480 nanometer wavelength range (mostly blue light) into a wider spectrum consisting of longer visible wavelengths that, when added to residual blue light, will appear as a pleasing white light. A variety of white LEDs are commercially available from a variety of manufacturers. Commercially available white LEDs range from "cool" white with a CCT of approximately 6000 Kelvin to "warm" white with a CCT of approximately 3000K.

In addition to the performance parameters described above, lighting of homes, offices and other areas often has esthetic concerns that are as important as the amount of illumination produced by the lighting system. Unlike an ideal black body radiator or natural daylight, solid-state lighting systems do not produce light that has a smooth and continuous spectral power distribution, despite the appearance of "white" light. FIG. 1 shows the spectral power distribution of a number of LED lights ranging from cool to warm, all of which show strong emissions in the blue and yellow regions.

It is known that phosphor-coated white LEDs permit some blue light to escape conversion by the phosphor, which light contributes to the blue spikes shown in FIG. 1. The blue light differs from natural light and also may appear harsh or otherwise unpleasing. In addition, other esthetic concerns often favor an emission spectrum that has more red and green wavelengths than would come from a true black body radiator. This type of light enhances the colors and color contrasts of furnishings and décor.

Although red and green light can be added to white LEDs to provide a more pleasing spectrum, this method may result in significant added cost for the extra LEDs and drive electronics, while the blue wavelength spike in the output spectrum remains.

Absorption filtered lamps, such as the General Electric's REVEAL® light bulbs) typically incorporate a filter element, such as neodymium, into the glass bulb to filter out the dull yellow light produced by the incandescent filament, thereby enhancing the appearance of the more vibrant light such as red. The addition of such a filter, however, causes a significant loss of light output, leading to a very low efficiency. For example, a REVEAL® 60 W bulb has a Lumens/Watt rating of only 11. Although an LED lamp may have a rating of 65 to 100 L/W, it can be expected that adding absorption filters would similarly reduce the efficiency as well as the light output, because the undesirable light is filtered and dissipated as heat. The heat added to the system from the absorptive filter may also contribute to lowering the life expectancy of the LED.

Adjusting the phosphor formulation of white LED lamps is also inadequate in providing the desired pleasing light in an LED, due to the wideband nature of the phosphor's emission spectrum. In other words, a narrow band of wavelengths typically cannot be removed from the white LED output spectrum by adjusting the phosphor formulation.

U.S. Published Application No. 20110175518, which is co-owned by the assignee of the subject application, describes various methods and apparatuses that can minimize undesirable blue light without the losses associated with absorption filtering.

BRIEF SUMMARY

There is a continued need for minimizing or eliminating light of undesirable wavelengths while enhancing light of desirable wavelength in solid state light sources.

A lighting device may be summarized as including an active light source operable to emit light across a plurality of wavelengths; at least one reflective filter that substantially passes light of a first set of wavelengths in the plurality of wavelengths and that substantially returns light of second set of wavelengths in the plurality of wavelengths, the second set of wavelengths including a first rejection band of about 400 nm to 480 nm and a second rejection band of about 570 nm to 600 nm, the at least one double-notch reflective filter positioned in an optical path between the active light source and an exterior of the lighting device to filter the light before the light reaches the exterior of the lighting device; and a wavelength shifter positioned and oriented to receive at least some of the light of the second set of wavelengths returned from the at least one double-notch reflective filter and in response emit light at shifted wavelengths toward an optical exit of the lighting device. The active light source of the lighting device may be a solid state light source, such as a light emitting diode (LED). The wavelength shifter may comprise a phosphor material. The lighting device may also include an optical element which may carry the at least one reflective filter which may take the form of one or more layers of a dielectric material. The lighting device may also include a second wavelength shifter disposed so that the active light source is positioned between the second wavelength shifter and the optical element or an optical exit.

A method of producing a lighting device may include positioning at least one double-notch reflective filter in an optical path between an active light source and an exterior of the lighting device to filter light before the light reaches the exterior of the lighting device, the at least one double-notch reflective filter transmitting a first set of wavelengths to the exterior of the lighting device and returning a second set of wavelengths away from the exterior of the lighting device; and positioning and orienting a first wavelength shifter to receive at least some of the light of the second set of wavelengths returned from the at least one double-notch reflective filter and in response emit light at shifted wavelengths toward an optical exit of the lighting device, wherein the one double-notch reflective filter is configured to reflect one or more wavelengths selected from the range of 400 nm to 480 nm and one or more wavelengths selected in the range of 570 nm to 600 nm.

The method may further include positioning and orienting a second wavelength shifter to receive at least some of the light of the second set of wavelengths returned from the at least one reflective filter, the second wavelength shifting being positioned co-planar with the active light source. Additionally, positioning and orienting the second wavelength shifter may include positioning the second wavelength shifter on a lateral periphery of the active light source and creating a pattern. Creating a pattern may include constructing the second wavelength shifter of at least two phosphors, wherein a first of the at least two phosphors absorbs wavelengths shorter than approximately 480 nm then emits green wavelengths of light, and a second of the at least two phosphors absorbs wavelengths in the range of 570 nm to 600 nm and emit red wavelengths of light (longer than 600 nm). A third phosphor may be optionally configured into the pattern which absorbs wavelength shorter than approximately 480 nm then emits red wavelengths of light, further enhancing the output of red light. Creating a pattern may further include creating a checkerboard pattern, a striped pattern, or a pie-shaped pattern out of the at least two phosphor materials.

A lighting device may be summarized as including lighting means for actively emitting light; reflective filtering means for substantially passing light of some wavelengths and substantially returning light of other wavelengths; and a wavelength shifting means for shifting at least some wavelengths of light emitted by the lighting means and returned by the reflective filter means. The lighting means may include an active light source operable to emit light across a plurality of wavelengths; the reflective filtering means may include at least one double-notch reflective filter that substantially passes light of a first set of wavelengths in the plurality of wavelengths and that substantially returns light of second set of wavelengths in the plurality of wavelengths, the second set of wavelengths including a first rejection band of about 400 nm to 480 nm and a second rejection band of about 570 nm to 600 nm, the at least one reflective filter positioned in an optical path between the active light source and an exterior of the lighting device to filter the light before the light reaches the exterior of the lighting device; and the wavelength shifting means comprises a wavelength shifter positioned and oriented to receive at least some of the light of the second set of wavelengths returned from the at least one double-notch reflective filter and in response emit light at shifted wavelengths toward an optical exit of the lighting device. The lighting device may be a light emitting diode package, the active light source may be at least one light emitting diode, the wave length shifter may be at least one phosphor material that may be a one-piece unitary structure with the at least one light emitting diode, and the double-notch reflective filter may be a one piece unitary structure of the diode light emitting diode package.

The lighting device may further include a cover overlying the at least one light emitting diode and the at least one phosphor material. The reflective filter may be carried on a surface, within or by the cover.

The lighting device may further include a silicone gel encapsulant received between the cover and the at least one light emitting diode.

A light emitting diode package may be summarized as including a substrate; at least one light emitting diode carried by the substrate; at least one reflective filter positioned with respect to the light emitting diode to substantially pass light of a first set of wavelengths in the plurality of wavelengths and substantially return light of second set of wavelengths in the plurality of wavelengths, the second set of wavelengths including a first rejection band of about 400 nm to 480 nm and a second rejection band of about 570 nm to 600 nm; and at least one wavelength shifter positioned with respect to the at least one light emitting diode and the at least one double-notch reflective filter to receive at least some of the light of the emitted by the at least one light emitting diode and to receive at least some of the second set of wavelengths returned from the at least one double-notch reflective filter and in response emit light at shifted wavelengths. The wave length shifter and the at least one light emitting diode may form a single-piece unitary structure. The wave length shifter may be deposited over the at least one light emitting diode.

The lighting device may further include a cover overlying the at least one light emitting diode. The double-notch reflective filter may be carried by the cover. The double-notch reflective filter may be deposited on a surface of the cover.

The lighting device may further include a silicone gel encapsulant received between the cover and the at least one light emitting diode.

The lighting device may further include a gap between the cover and the at least one light emitting diode.

A silicone gel encapsulant may overlie directly or indirectly the at least one light emitting diode. The wavelength shifter is incorporated into the silicone gel encapsulant, for example forming an integral part thereof. The reflective filter may be carried directly or indirectly by the silicone gel encapsulant.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Described herein are apparatus and method for minimizing or eliminating undesirable light while enhancing desirable light of solid state lighting sources without causing significant losses in energy and light output.

In various embodiments, a dielectric reflective filter is used in association with a solid state lighting source. In particular, the dielectric reflective filter substantially reflect two distinctive notch bands of light in the visible region, including a first notch band of wavelengths ranging from 400 to 490 nm and a second notch band of wavelengths ranging from 570 nm to 600 nm. The remaining wavelengths in the visible spectrum are substantially transmitted. Such a reflective filter is "dichroic" and uses the principle of thin film interference, which selectively reinforces certain wavelengths of light and interferes with other wavelengths.

Figure 1:
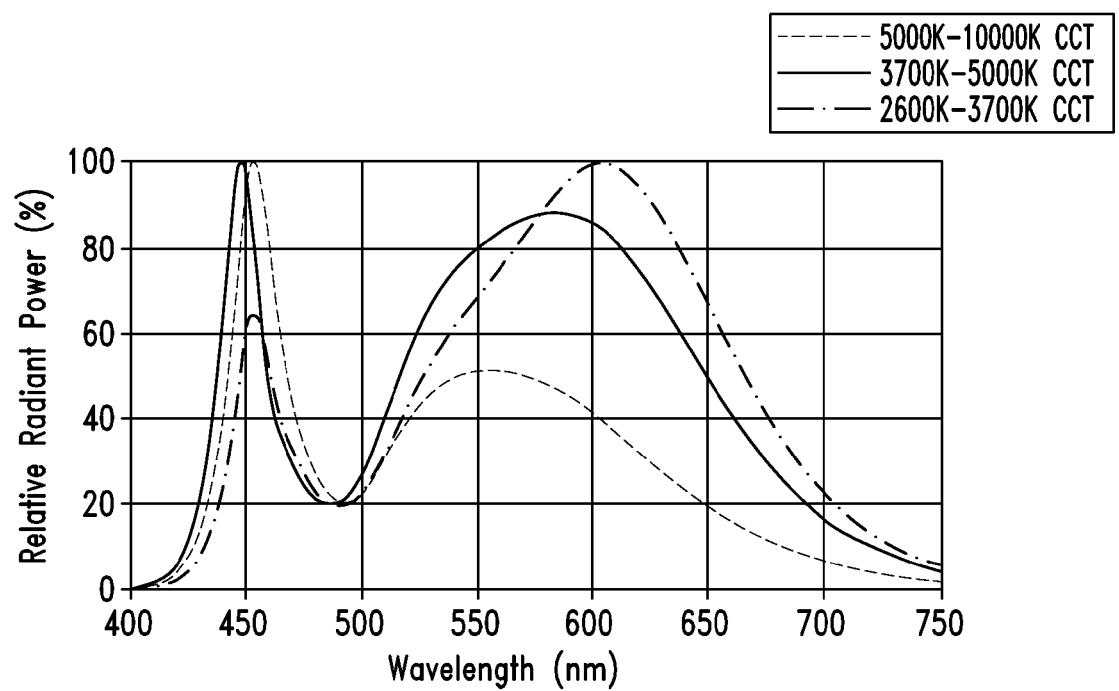
FIG. 1 shows radiant power distributions of standard LED lights.

FIG. 1A schematically shows a transmission spectrum of visible light transmitted through a double-notch reflective filter. Notch bands are deep attenuations, also referred to as "rejection bands" or "stop band," with high transmission on either side of the bands. The rejection band is typically characterized with a center wavelength ($\lambda_c$), which is the wavelength at the center of the band. The width of the rejection band is typically measured at a certain fraction of the transmission (e.g., 10% or 50%) and can range from several nanometers to several tens of nanometers. FIG. 1A shows, by way of illustration, a first notch band with a first center wavelength ($\lambda_c^1$) at about 450 nm (20) and a second notch band with a second center wavelength ($\lambda_c^2$) at about 585 nm (30). Rejection bands typically filter more than 99% of light within the bandwidth. The average transmission outside of the rejection bands can be 75% or more, or more typically, 85% or more.

Thus, by reflecting the undesirable blue light (400-490 nm) and dull yellow light (570-600 nm), more pleasing and vibrant colors such as red and green wavelengths in the transmitted light are accentuated. Moreover, because the blue wavelengths and yellow wavelengths are substantially reflected back into the LED, they may utilize the existing phosphor or a remote phosphor in the LED and re-emit as respective longer wavelength light, thereby recycling the energy contained in the reflected light. Moreover, the reflected yellow wavelength can be re-emitted at wavelengths in the red region, further enhancing the red component of the light output.

Figure 2A:
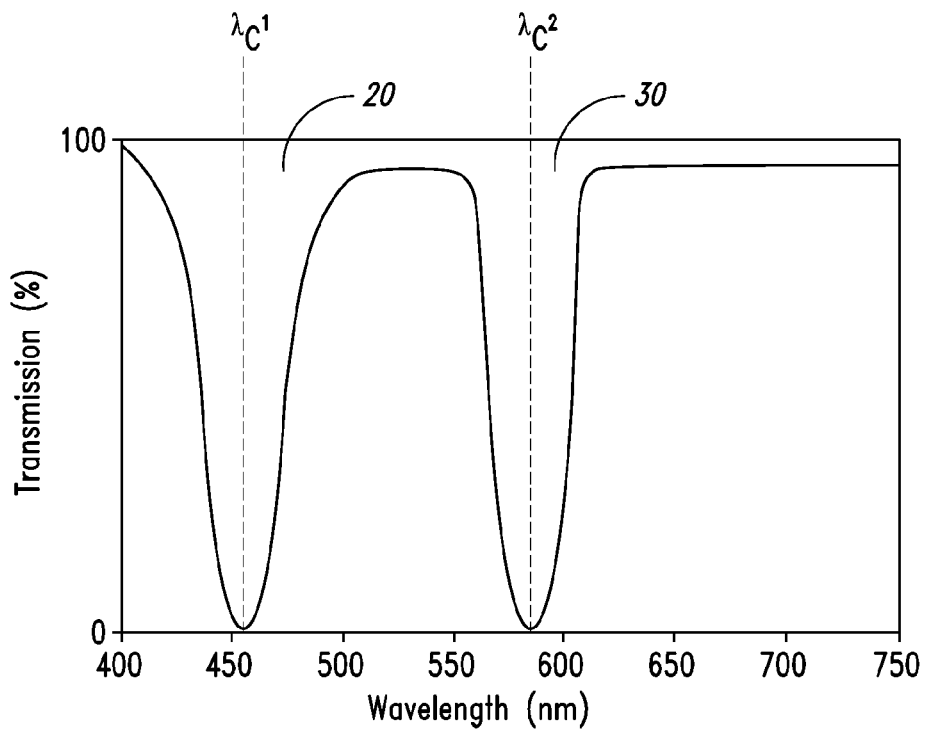
FIG. 2A shows a transmission spectrum of a double-notch reflective filter according to one embodiment.
Figure 2B:
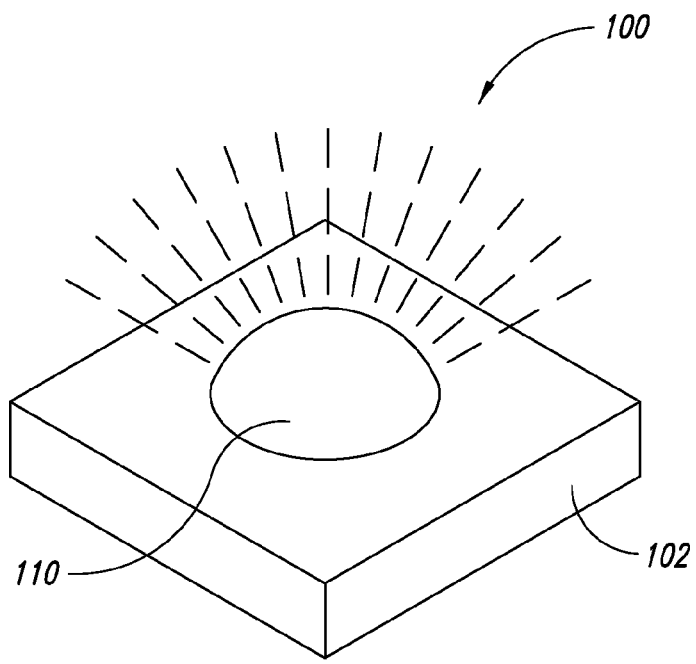
FIG. 2B is an isometric view of a lighting device, according to one illustrated embodiment.
Figure 3:
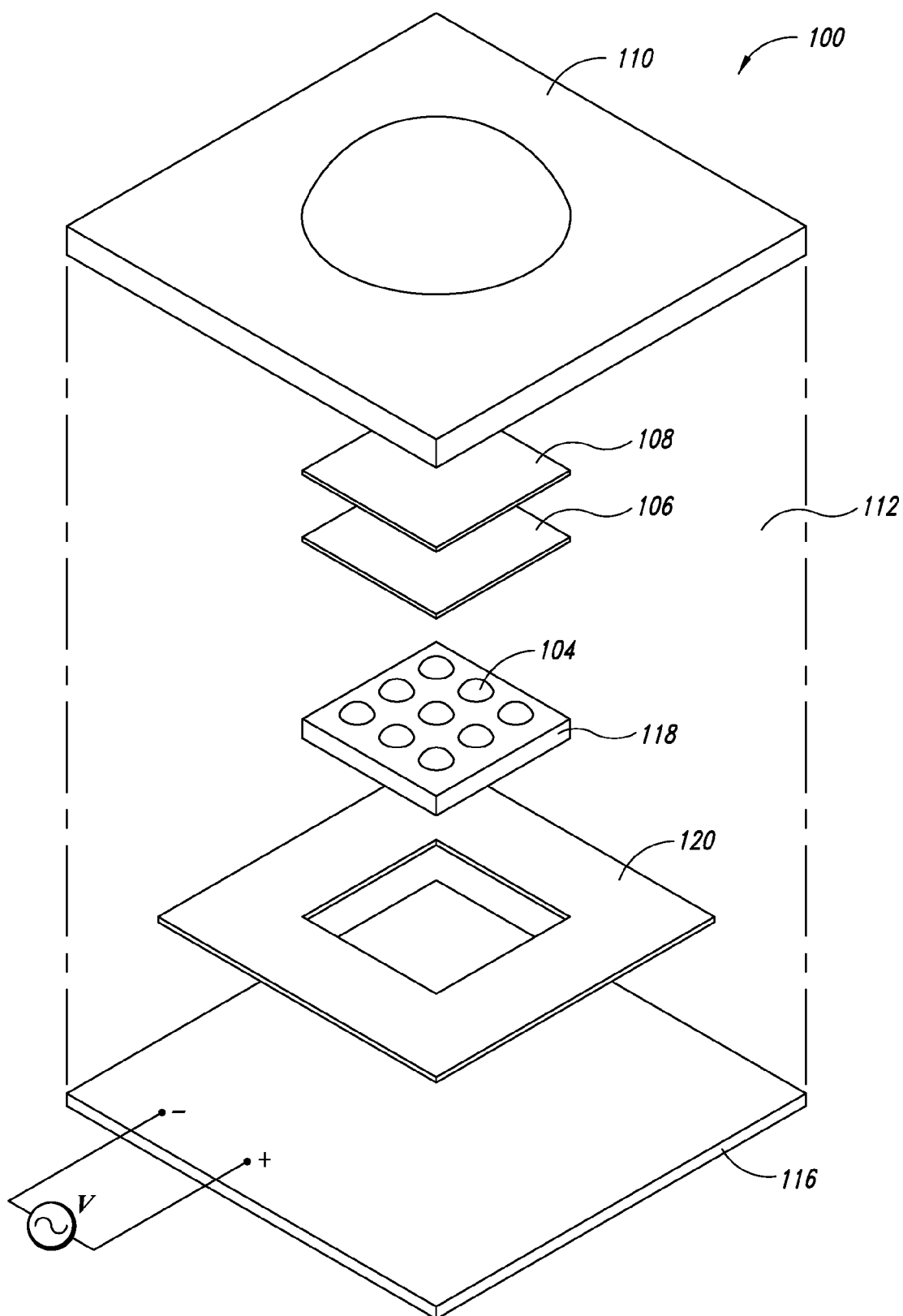
FIG. 3 is an exploded isometric view of the lighting device of FIG. 1 illustrating an array of light emitting diodes, a wavelength shifter, and a reflective filter positioned to pass some wavelengths of light while returning other wavelengths of light toward the wavelength shifter.
Figure 4:
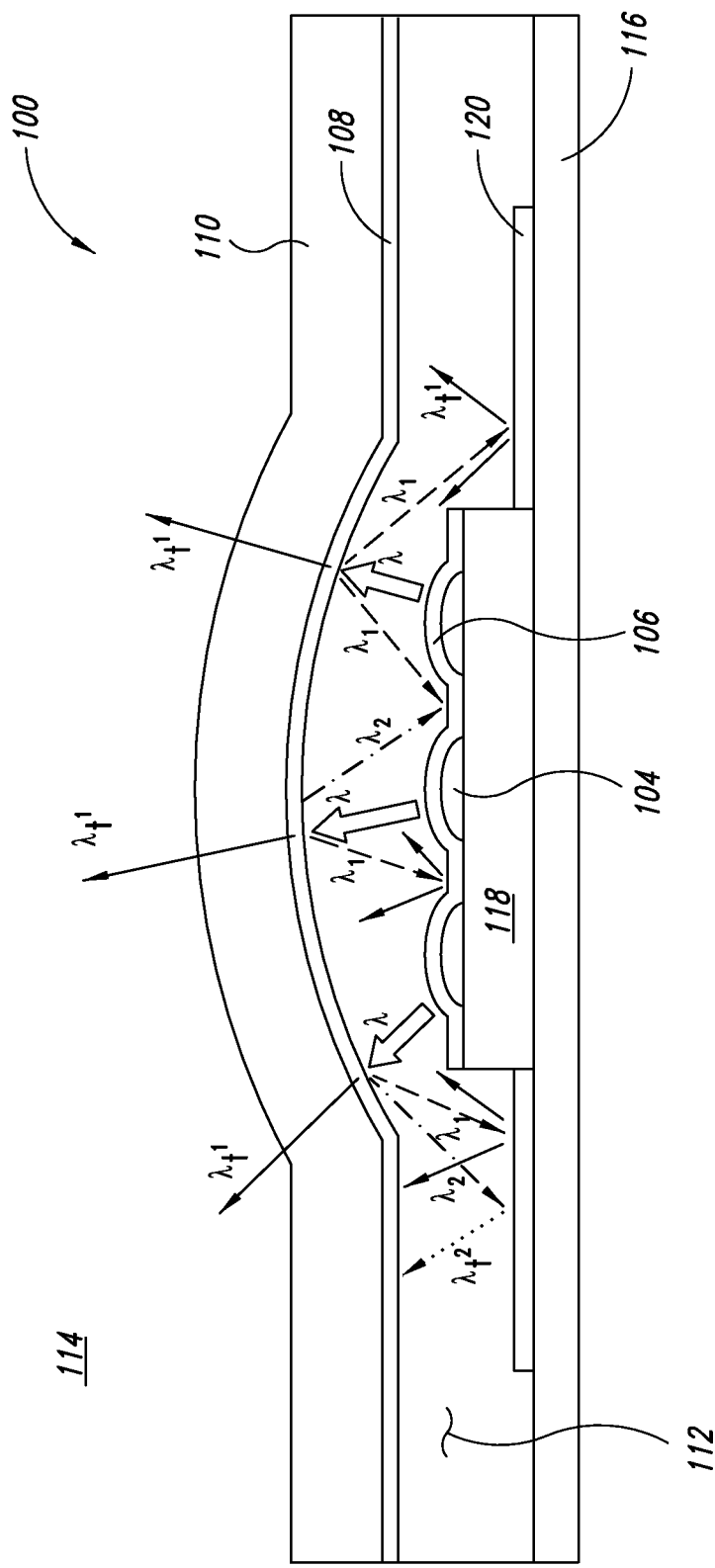
FIG. 4 is side elevational view of the lighting device of FIGS. 2B and 3, showing an exemplary ray trace of light emitted by the array of light emitting diodes, passed in part and returned in part by the reflective filter.

FIGS. 2B, 3 and 4 show a lighting device 100, according to one illustrated embodiment.

The lighting device 100 includes a housing 102 which contains one or more light sources, for instance an array of light emitting diodes (LEDs) 104, at least a first wavelength shifter 106 and one or more double-notch reflective filters 108. As discussed in detail below, the LEDs 104 emit light, the wavelength shifters 106 shifts wavelengths of the light to a more desirable wavelength, and the reflective filter passes light of some desirable wavelengths while returning or reflecting light of some less desirable wavelengths to the wavelength shifter(s) to have the wavelength shifted and re-emitted.

The housing 102 may include or carry one or more optical elements, for example a window or lens 110 through which light of at least some wavelengths is transmitted from an interior 112 of housing 102 to an exterior 114 thereof. The window or lens 110 may pass light with little or no change. Alternatively, the window or lens 110 may be shaped to focus light or disperse light. The window or lens 110 may provide protection to the light source (e.g., LEDs 104) from environmental contamination or physical damage.

As shown in FIG. 3, lighting device 100 may include a printed circuit board (PCB) 116. The PCB 116 may form part of the housing 102. The PCB 116 may carry circuitry (not shown) to supply electrical power to the LEDs 104, for instance power regulator, rectifier, voltage converter or other circuitry. Electrical power may be supplied from an electrical power source such as voltage source V. The voltage source V may be a direct current source, such as a battery, or it may be an alternating current source, such as grid power or a common household electrical outlet. Examples of alternating current sources that may be used to supply electrical power to the circuitry of the PCB 116 include interior or exterior power from a home, interior or exterior power from a commercial building, or power such as is generally routed to an outdoor light pole.

The LEDs 104 may be formed on a die or substrate 118. The die or substrate 118 may be physically mounted to PCB 116 and electrically coupled to circuitry carried by the PCB 116 to receive power for LEDs 104. The die or substrate 118 may, for example, be coupled to PCB 116 via ball grid array, wire bonding, or a combination of the two. The die or substrate 118 and PCB 116 may advantageously function as a heat sink for LEDs 104.

The first wavelength shifter 106 may take the form of one or more layers of a wavelength shifting material positioned to shift a wavelength of at least some of the light emitted by the LEDs 104. For example, the first wavelength shifter may take the form one or more layers of a phosphor material. The one or more layers of phosphor may, for example, be carried directly on the die or substrate 118 where the LEDs are formed on a die or substrate. Alternatively, the one or more layers of phosphor may be coated on a transparent or translucent bulb or other enclosure where the LEDs are formed as bulbs. LEDs with phosphor coatings are commercially available, and could be purchased by the manufacturer of the lighting device 100 from an LED supplier.

In response to electrical power being supplied, the LEDs 104 are turned ON and emit light. The wavelength range of the light emitted is a function of the particular type of wavelength shifting material 106 carried by or overlying the LEDs 104. White LEDs are used as the primary light source in solid-state lighting systems. These LEDs are typically manufactured by placing one or more phosphor layers either on a blue emitting LED die or onto a lens or window through which blue light from an LED will pass. In one embodiment, LEDs 104 are white LEDs (e.g., blue emitting LEDs with appropriate phosphor coating).

As noted in the background (FIG. 1A), white LEDs have two strong emissions in the blue region and yellow region. The double-notch reflective filter 108 is positioned to allow light of certain desired wavelengths to substantially pass to the exterior of the housing, while reflecting or rejecting light of certain undesirable wavelengths, including those in the short wavelength region (blue) and the middle wavelength region (yellow) of the visible spectrum. For example the reflective filter may be positioned between the optical element 110 and LEDs 104.

As used herein, unless specified otherwise, a double-notch reflective filter may be simply referred to as a reflective filter. The reflective filter is typically formed of dielectric materials and may take a variety of forms, for example, a thin film stack of alternating layers of dielectric materials with different refractive indices (e.g., metallic oxides, such as titanium oxide, silicon, and salts such as magnesium fluoride), or a single layer of material, the refractive index of which varies throughout its thickness (a rugate filter). Unlike absorption filters, light that is not transmitted through the coating is substantially reflected back toward the light source. Dielectric reflectors typically have a very long service lifetime versus organic based absorption filters. The double-notch reflective filter may be formed on, in or as part of the optical element 110. For example, the reflective filter may be formed as one or more layers on an inner surface of the optical element 110, the optical element 110 providing environmental protection for the reflective filter.

The reflective filter 108 may be designed to reflect or return a first light of wavelengths below approximately 480 nm. For example, the reflective filter 108 may reflect or return a first light of wavelengths from approximately 440 nm to approximately 480 nm, or approximately 400 nm to approximately 480 nm. In addition, the reflective filter 108 is designed to reject or return a second light of wavelength above 570 nm. For example, the reflective filter 108 may reflect or return a second light of wavelengths from approximately 570 nm to approximately 600 nm. As one of skill in the art will recognize, optical elements such as filters typically do not have very precise cut off values. Thus, the terms "substantially" and "approximately" are used herein to denote the inherent impreciseness of such optical elements. Generally, any optical element that is at least 80% effective within 25% of the denominated value will suffice, although in some embodiments even lower efficiencies and wider ranges may be suitable. The light that is passed by reflective filter 108 propagates to and through optical element 110 to the exterior of lighting device 200, and the light that is returned (e.g., reflected or remitted) propagates back into the interior 112 of the housing to the wavelength shifter 106 and, optionally to a back reflector 120 to be wavelength shifted.

Wavelength shifter 106 absorbs a substantial portion of light including wavelengths from approximately 440 nm to approximately 480 nm and emits light of longer wavelengths. Alternatively but less commonly, the wavelength shifter 106 may absorb longer wavelengths and emit shorter wavelengths of light. As noted above, the wavelength shifter 106 may take the form of one or more phosphor materials. In one embodiment, wavelength shifter 106 emits light of wavelengths corresponding to red light. In another embodiment, wavelength shifter 106 emits light of wavelengths corresponding to green light. Wavelength shifter 106 is positioned between reflective filter 108 and LEDs 104. The wavelength shifter 106 converts at least some of the blue light directly emitted by the LEDs 104, as well as at least some of the blue light that was returned by the reflective filter 108, to light of another more desirable wavelength. By eliminating the undesirable blue spike in the output spectrum, lighting device 100 transmits a better, i.e., more pleasing, more efficient, and/or potentially less hazardous, color temperature of light as well as transmitting more efficiently. The less light that is absorbed and wasted as heat, the more efficient the lighting device becomes overall. Additionally, when correctly balanced light is employed, the intensity of light required to achieve a desired perceived level of illumination may be lower, requiring less power. Using the phosphor which is already supplied as part of the LEDs 104 to shift the light returned or reflected by the reflective filter 108 eliminates the need for additional rare-earth phosphors and the associated costs.

Optionally the housing may also include the back reflector 120. The back reflector 120 is denominated by the term "back" since the back reflector may be positioned relatively behind at least a portion of the light source (e.g., LEDs 104). The back reflector 120 may be a simple reflector or may include one or more layers of a wavelength shifting material (e.g., phosphor) hence the back reflector may constitute at least a second wavelength shifter and is also referred to as "remote phosphor" to differentiate from the LED phosphor 106. The back reflector 120 may be positioned co-planar with PCB 116, for example carried on a surface of the PCB 116. The back reflector 120 may work in concert with the reflective filter 108. The back reflector 120 may absorb light reflected from reflective filter 108 with wavelengths in the approximately 400 nm to approximately 480 nm range, as well as 570 nm-600 nm and emit light with longer wavelengths, respectively. Short and middle wavelength light reflected by the reflective filter 108 that are not absorbed by the wavelength shifter 106 (e.g., LED phosphor) strike the back reflector 120, are then absorbed and re-emitted as light in the approximately 550 nm to approximately 650 nm red-orange wavelengths. This emitted red-orange light further provides an additional optical power gain in the visible region, particularly in the red region. In one embodiment, the back reflector 120 is used in the absence of wavelength shifter 106. The configuration of lighting device 100 utilizing the back reflector 120 has high efficiency and low CCT output with very pleasing, broad-spectrum light that can enhance color contrast of lit objects.

The optical paths of various wavelength bands of light in the lighting device 100 are illustrated in FIG. 4.

Light emitting from LEDs 104 is first converted by the first wavelength shifter (e.g., LED phosphor) 106 resulting in light rays λ that are in a range of wavelengths inclusive of mostly a desirable range of wavelengths and some an undesirable range of wavelengths. As shown, light ray λ propagates to reflective filter 108 where light rays $\lambda_t^1$ of the desirable range of wavelengths are substantially transmitted and light rays of the undesirable range of wavelengths, including $\lambda_1$ (short wavelength, primarily escaping blue light of the LED) and $\lambda_2$ (middle wavelength, primarily dull yellow light) are reflected or returned toward the interior 112.

The double-notch reflective filter 108 is designed to return or reflect $\lambda_1$ and $\lambda_2$. The returned or reflected light rays $\lambda_1$ are then absorbed by wavelength shifters, namely the wavelength shifter 106 and back reflector 120. Light rays $\lambda_1$ that are returned or reflected toward the LEDs 104 are absorbed by wavelength shifter (e.g., LED phosphor material) 106. Light rays $\lambda_1$ that are reflected toward the periphery of LEDs 104 are absorbed by wavelength shifter material of the back reflector 120. After absorption of light rays $\lambda_1$, i.e., re-absorption of the escaping blue light, the wavelength shifter 106 and back reflector 120 re-emit light rays $\lambda_r^1$, some of which propagate to and through reflective filter 106 and optical element 110. In one embodiment light rays $\lambda_r^1$ include wavelengths greater than approximately 480 nm and light rays $\lambda_1$ include wavelengths from approximately 400 nm to approximately 480 nm. Since conversion or shifting of the wavelengths may not be complete, a portion of light of undesirable wavelengths may again be returned or reflected by the reflective filter 106 until substantially all light emitted by LEDs 104 has be passed into the exterior 114 or lost to heat.

In addition and simultaneously, the returned or reflected light rays $\lambda_2$ are also absorbed by wavelength shifters, namely the wavelength shifter 106 and back reflector 120. Light rays $\lambda_2$ that are returned or reflected toward the LEDs 104 are absorbed by wavelength shifter (e.g., LED phosphor material) 106. Light rays $\lambda_2$ that are reflected toward the periphery of LEDs 104 are absorbed by wavelength shifter material of the back reflector 120. After absorption of light rays $\lambda_2$, the wavelength shifter 106 and back reflector 120 re-emit light rays $\lambda_r^2$, some of which propagate to and through reflective filter 106 and optical element 110. In one embodiment light rays $\lambda_r^2$ include wavelengths greater than approximately 600 nm and light rays $\lambda_2$ include wavelengths from approximately 570 nm to approximately 600 nm. Since conversion or shifting of the wavelengths may not be complete, a portion of light of undesirable wavelengths may again be returned or reflected by the reflective filter 106 until substantially all light emitted by LEDs 104 has be passed into the exterior 114 or lost to heat. Consequently, light output in the red region (wavelengths longer than 600 nm) is increased due to re-absorption of the yellow light, thus further enhancing the output of the desirable light.

Figure 5:
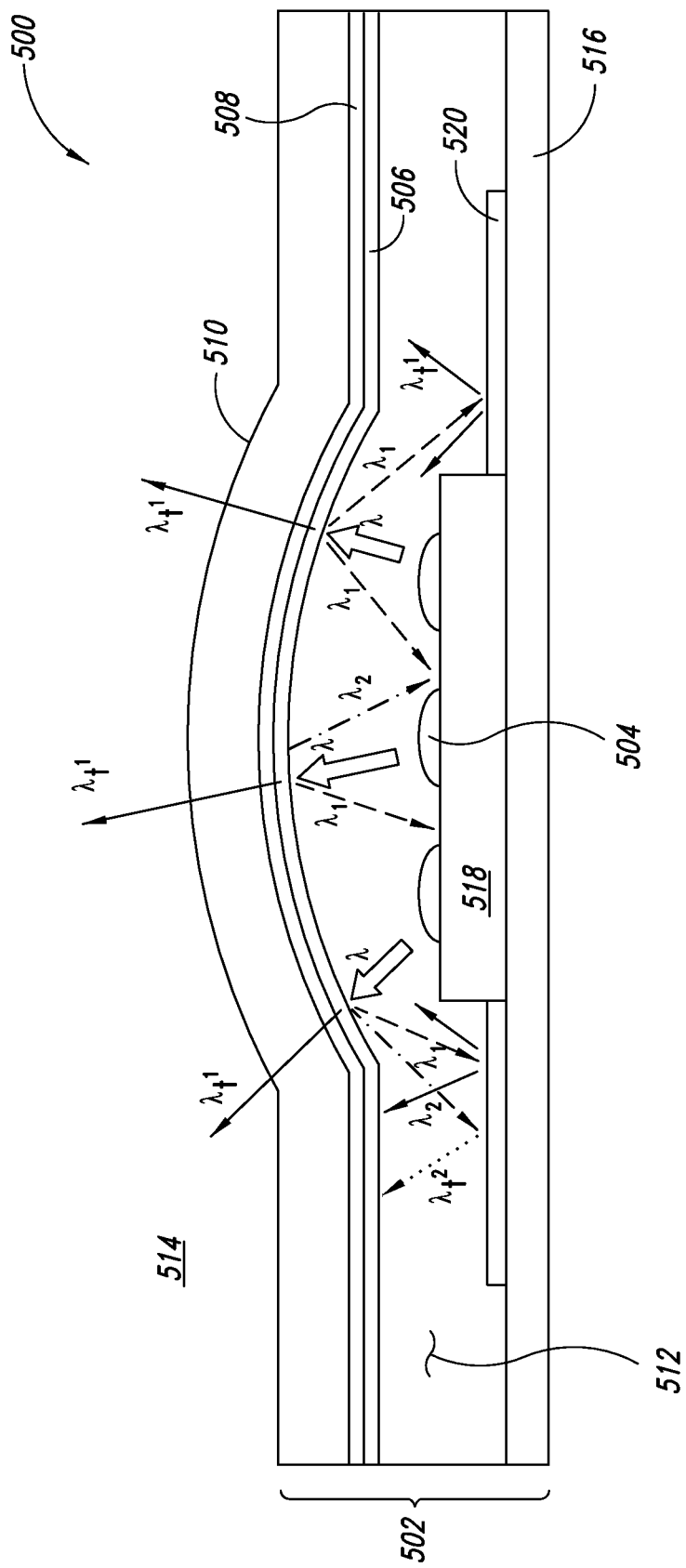
FIG. 5 is side elevation view of a lighting device according to another illustrated embodiment, with the wavelength shifter positioned proximate the reflective filter and showing an exemplary ray trace of light emitted by the array of light emitting diodes, passed in part and returned in part by the reflective filter.

FIG. 5 shows a lighting device 500, according to another illustrated embodiment.

The lighting device 500 includes a housing 510 having an interior 512 and exterior 514 and which contains one or more light sources, for instance an array of LEDs 504, at least a first wavelength shifter 506, one or more reflective filters 508, optical element 510, PCB 516, die or substrate 518, and optionally back reflector 520. Many of the elements of the lighting device 500 are identical or similar to the elements of the lighting device 100 (FIGS. 2B-4) so description of such elements will not be repeated. The description of lighting device 500 will focus on the differences between the embodiments.

In contrast to the lighting device 100 (FIGS. 2A-4), the lighting device 500 affixes the wavelength shifter 506 to the reflective filter 508. For example, the wavelength shifter 506 may take the form of one or more layers of one or more phosphor material deposited on the reflective filter 508, for example deposited on an inside facing surface of the reflective filter 508. The reflective filter 508 may in turn take the form of thin film stack or single layer rugate filter, deposited on the optical element 510, for instance deposited on an inside facing surface of the optical element 510.

The LEDs 504 emit light rays λ which include desirable wavelengths and undesirable wavelengths, the latter include light rays $\lambda_1$ and $\lambda_2$. As shown, at least some of the light rays λ propagate from LEDs 504 to wavelength shifter 506. At wavelength shifter 520 some light rays $\lambda_t^1$ of desirable wavelengths pass through reflective filter 508, while reflective filter 508 returns or reflect some light rays $\lambda_1$ and $\lambda_2$ of undesirable wavelengths. The first wavelength shifter 506 reabsorbs some of the returned light rays $\lambda_1$ and $\lambda_2$ while the back reflector 520 absorbs some of the returned light rays $\lambda_1$ and $\lambda_2$. The first wavelength shifter 506 and/or the back reflector 520 re-emits light, predominately at shifted or longer wavelengths ($\lambda_t^1$ and $\lambda_t^2$) than the wavelengths of the light absorbed.

Figure 6:
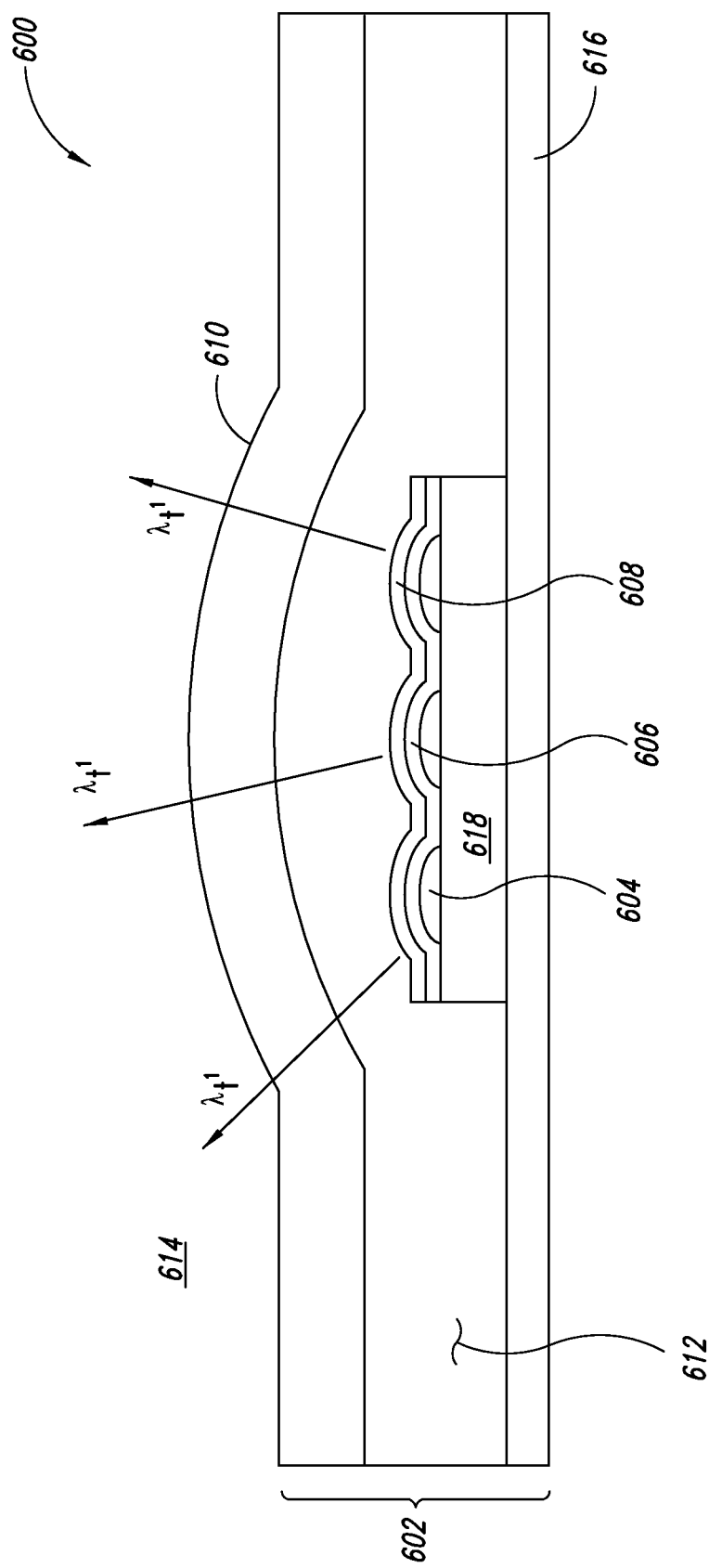
FIG. 6 is a side elevational view of a lighting device according to yet another illustrated embodiment, with a reflective filter and wavelength shifter integrally formed on the array of light emitting diodes and showing an exemplary ray trace of light emitted by the array of light emitting diodes, passed in part and returned in part by the reflective filter.

FIG. 6 shows a lighting device 600, according to another illustrated embodiment.

The lighting device 600 housing 610 having an interior 612 and exterior 614 and which contains one or more light sources, for instance an array of LEDs 604, at least a first wavelength shifter 606, one or more reflective filters 608, optical element 610, PCB 616, and die or substrate 618. Many of the elements of the lighting device 600 are identical or similar to the elements of the lighting device 100 (FIGS. 2B-4) so description of such elements will not be repeated. The description of lighting device 600 will focus on the differences between the embodiments.

In contrast to the lighting device 100 (FIGS. 2B-4), the lighting device 600 disposes the reflective filter 608 on the first wavelength shifter 606. The lighting device 600 also omits the optional back reflector of the lighting device 100.

The LEDs 604 emit light rays, including transmitted light rays ($\lambda_t^1$) and two bands of undesirable light rays ($\lambda_1$ and $\lambda_2$). The undesirable light rays are reflected back to the interior of the LED 604, absorbed by the first wavelength shifter 606 which re-emits the light shifted to predominately desirable wavelengths ($\lambda_t^1$ and $\lambda_t^2$). The reflective filter 608 passes light rays $\lambda_t^1$ and $\lambda_t^2$ of predominately desirable wavelengths and returns or reflects light of predominately undesirable wavelengths ($\lambda_1$ and $\lambda_2$) to the first wavelength shifter 606, for re-absorption and re-emission at shifted wavelengths.

Figure 7:
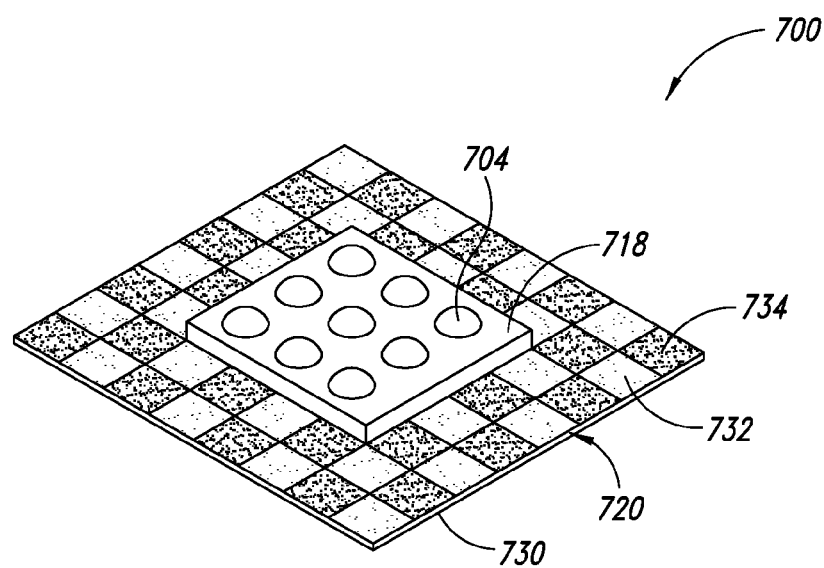
FIG. 7 is an isometric view of a checker pattern of wavelength shifters disposed on the periphery of a lighting device, according to one illustrated embodiment.

FIG. 7 shows a portion 700 of a lighting device, including a patterned back reflector 720, according to one illustrated embodiment.

The patterned back reflector 720 includes a pattern of wavelength shifting materials, such as phosphors. While illustrated in use with an array of LEDs 704 on a die or substrate 718, the patterned back reflector 720 may be employed in any of the previously described lighting devices 100, 400, and 500.

The patterned back reflector 720 may include a substrate 730 which carries (i.e., directly or indirectly) a repeating pattern of one or more wavelength shifter materials. For example, the substrate 730 may carry a first wavelength shifter material 732 and a second wavelength shifter material 734. Areas of the first and the second wavelength shifter materials 732, 734 may alternate, for example in a checkerboard pattern. The die or substrate 718 which carries the LEDs 704 may be carried directly on the pattern of wavelength shifter materials 732, 734 or the die or substrate 718 may be placed in an open area on the substrate 730 which is peripherally surrounded by the pattern of wavelength shifter materials 732, 734. While illustrated as employing two different wavelength shifter materials 732, 734, some patterned back reflectors 720 may employ more than two different wavelength shifter materials 732, 734.

The patterned wavelength shifter material 732, 734 may be disposed onto a supporting structure, such as a printed circuit board or other substrate, before a light source, such as array of LEDs 704, is coupled to the supporting structure. Wavelength shifter materials 732 and 734 may convert longer wavelengths of light to shorter wavelengths or vice versa. For example, the first wavelength shifter material 732 may emit light of predominately green wavelengths after absorbing light of predominately wavelengths below approximately 480 nm. The second wavelength shifter material 734 may emit light of predominately red light wavelengths after absorbing light of in the range of 570 nm to 600 nm and emit red wavelengths of light (longer than 600 nm). A third phosphor (not shown) may be optionally configured into the pattern which absorbs wavelength. A third phosphor may be optionally configured into the pattern which absorbs predominately wavelengths below approximately 480 nm and emit light of predominately red wavelengths, further enhancing the red component of the light. As previously described, the wavelength shifter materials 732, 734 may be comprised of different phosphor materials. Converting reflected blue light to both green and red light may advantageously result in a broadening of the final emission spectrum from any lighting device 100, 400, 500 incorporating the patterned back reflector 720.

The checkerboard pattern of patterned back reflector 720 may increase an efficiency of producing warmer white light. Light emitted from phosphor based LEDs typically falls outside of the CIE curve which is centered on green and is the photopic standard curve. Additionally, when a red phosphor (i.e., phosphor that predominately emits red light) is added to make white light warmer, the red phosphor tends to absorb blue light in addition to green light which has been emitted by other phosphors used in the LED. The absorption and conversion of already converted green light results in additional conversion efficiency losses. Thus, the patterned back reflector 720 may emit a broad warm light inclusive of both green and red phosphors while minimizing losses incurred by undesired absorption and conversion.

Figure 8:
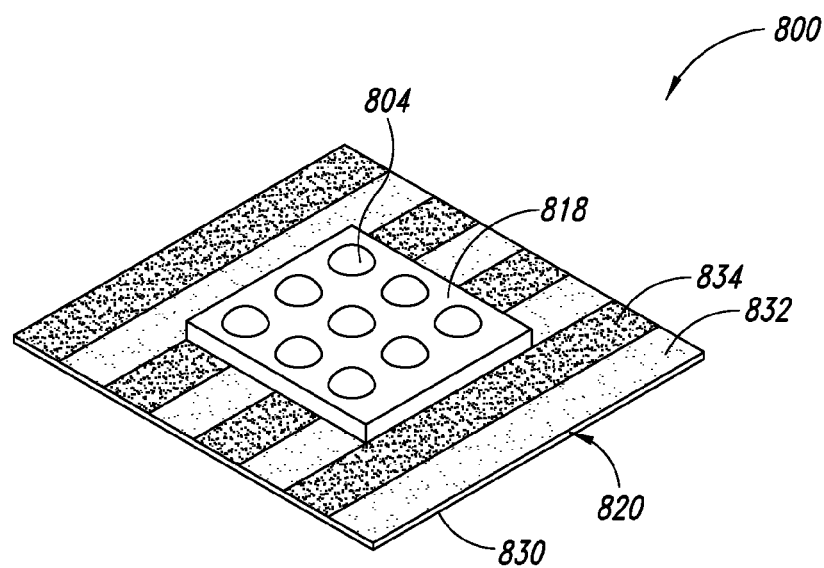
FIG. 8 is an isometric view of a striped pattern of wavelength shifters disposed on the periphery of a lighting device, according to one illustrated embodiment.

FIG. 8 shows a portion 800 of a lighting device, including a patterned back reflector 820, according to one illustrated embodiment.

The patterned back reflector 820 includes a pattern of wavelength shifting materials, such as phosphors. While illustrated in use with an array of LEDs 804 on a die or substrate 818, the patterned back reflector 820 may be employed in any of the previously described lighting devices 100, 400, 500.

The patterned back reflector 720 may include a substrate 730 which carries (i.e., directly or indirectly) a repeating pattern of one or more wavelength shifter materials. For example, the substrate 830 may carry a first wavelength shifter material 832 and a second wavelength shifter material 734. Areas of the first and the second wavelength shifting materials 732, 734 may alternate, for example, in a stripped pattern. The die or substrate 818 which carries the LEDs 804 may be carried directly on the pattern of wavelength shifter materials 832, 834 or the die or substrate 818 may be placed in an open area on the substrate 830 which is peripherally surrounded by the wavelength shifter materials 832, 834. While illustrated as employing two different wavelength shifter materials 832, 834, some patterned back reflectors 820 may employ more than two different wavelength shifter materials 832, 834.

The first wavelength shifter material 832 may emit light of predominately green wavelengths after absorbing light of predominately wavelengths below approximately 480 nm.

The second wavelength shifter material 834 may emits light of predominately red wavelengths after absorbing light of predominately wavelengths below approximately 480 nm. Alternatively, the second wavelength shifter material 834 may emits light of predominately red wavelengths after absorbing light of predominately wavelengths of approximately 570 nm to 600 nm. While illustrated as a stripped pattern, other repeating patterns, and even non-repeating patterns, may be employed. For example the wavelength shifter materials 832, 834 may be disposed or deposited in an alternating pie-shaped pattern.

The construction of patches of wavelength shifting material on a periphery of a light source may substantially reduce loss of wavelength conversion efficiency that may result from mixing the green emitting and red emitting wavelength shifter materials or of layering such different wavelength shifting materials for example by coating one wavelength shifting material one on top of another.

While the patterned wavelength shifting materials 732, 734, 832, 834 (FIGS. 7 and 8) are illustrated as part of the back reflector, identical or similar patterns of wavelength shifting material may be employed elsewhere, for instance as part of a first wavelength shifter 814 disposed between a light source and an optical element.

Figure 9:
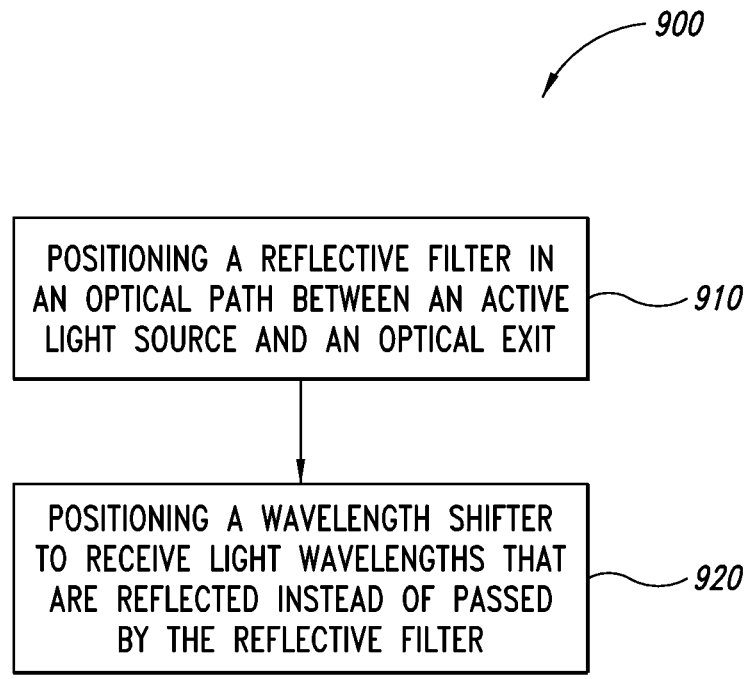
FIG. 9 is a flow diagram of a method of producing a lighting device, according to one illustrated embodiment.

FIG. 9 shows a method 900 for producing a lighting device such as lighting devices 100-500, according to one illustrated embodiment.

At 910 a reflective filter is positioned in an optical path between an active light source and an optical exit. Positioning the reflective filter may include positioning the reflective filter on an optical element or disposing the reflective filter to cover the active light source. The reflective filter may be masked so that openings exist in the reflective filter allowing some unfiltered light to pass through the optical element.

At 920, a wavelength shifter is positioned to receive light of predominately undesirable wavelengths that is reflected instead of being passed by the double-notch reflective filter. The wavelength shifter emits light of a different wavelength than those received. Positioning the wavelength shifter may include positioning the wavelength shifter between an active light source and an optical element. Positioning the wavelength shifter may include positioning the wavelength shifter to be co-planar or behind the active light source, for example as a back reflector. As previously described, the wavelength shifter may comprise more than one type of wavelength shifter material so that it emits a spectrum of warm light.

Figure 10A:
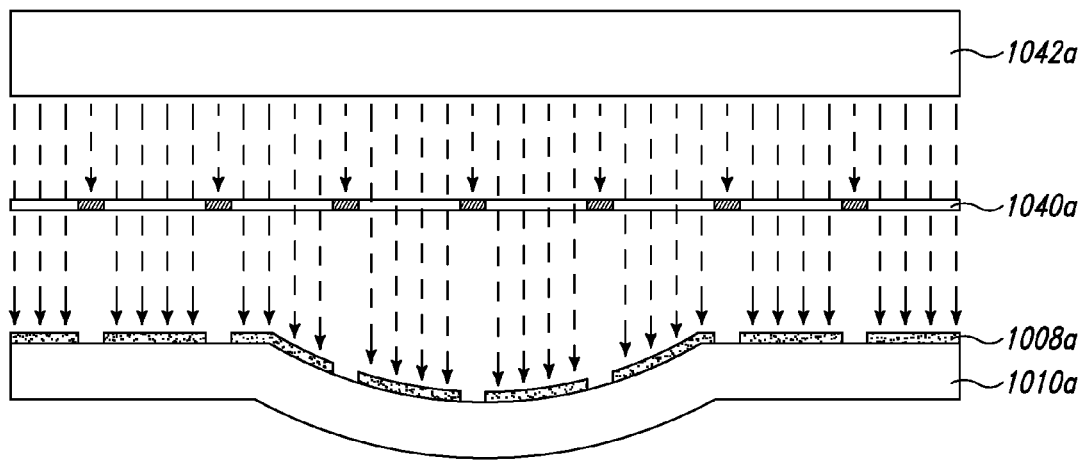
FIG. 10A is a side elevational view of a mask that may be applied to an optical element of a lighting device, according to one illustrated embodiment.

FIG. 10A shows a mask 1040a and applicator 1042a being used to form a reflective filter 1008a on an optical element 1010a, according to one illustrated embodiment.

In some cases it is desirable to eliminate most, but not all of the wavelengths of light to be filtered and converted, e.g., light with wavelengths shorter than approximately 480 nm. Before forming the reflective filter 1008a on the optical element 1010a, the mask 1040a may be positioned between the optical element 1010a and the applicator 1042a. The applicator 1042a applies the reflective filter 1008a as a number of thin film layers to optical element 1010a. Alternatively, the applicator 1042a may apply a number of thin film layers to a light source to form the reflective filter 1040a on the light source (e.g., array of LEDs). The mask 1040a may take the form of a screen that produces a shadow of uncoated areas on the surface being coated. In this way, no contact is made with the optical element 1010a or LED optic. Also, no time-consuming mask application and removal operations are required. Additionally, the non-contact mask may be re-usable some number of times.

Figure 10B:
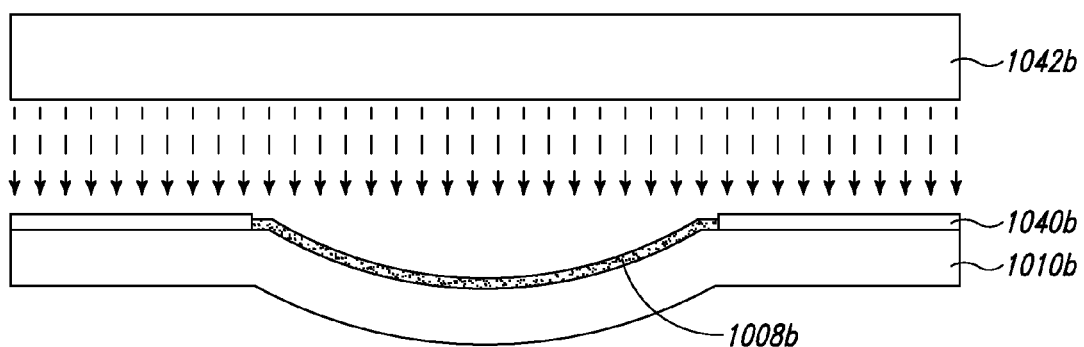
FIG. 10B is a side elevational view of a mask that may be applied to an optical element of a lighting device, according to another illustrated embodiment.

FIG. 10B shows a mask 1040b and applicator 1042b being used to form a reflective filter 1008b on an optical element 1010b, according to another illustrated embodiment.

Before forming the reflective filter 1008b on the optical element 1010b, the mask 1040b may be positioned between the optical element 1010b and the applicator 1042b. The applicator 1042b applies the reflective filter 1008b as a number of thin film layers to optical element 1010b. Alternatively, the applicator 1042b may apply a number of thin film layers to a light source to form the reflective filter 1040b on the light source (e.g., array of LEDs). The mask 1040b may take a variety of forms, for example an adhesive tape or a stencil applied to the optical element 1010b or an LED optic.

Applying the mask 1040b to an area surrounding the most direct optical path from an active light source to an optical exit is another way of adjusting the reflection percentage of emitted light. The mask 1040b is removed after the reflective filter 1008b has been formed. This permits a simpler, high reflectivity filter coating to be used while still passing some of the light having wavelengths less than some desired cutoff, for example approximately 480 nm. A high proportion of the reflected light can be directed back to an LED phosphor coating that may exist between reflective filter 1008b and the light source. The reflected light may thus be converted to longer wavelength light.

Figure 10C:
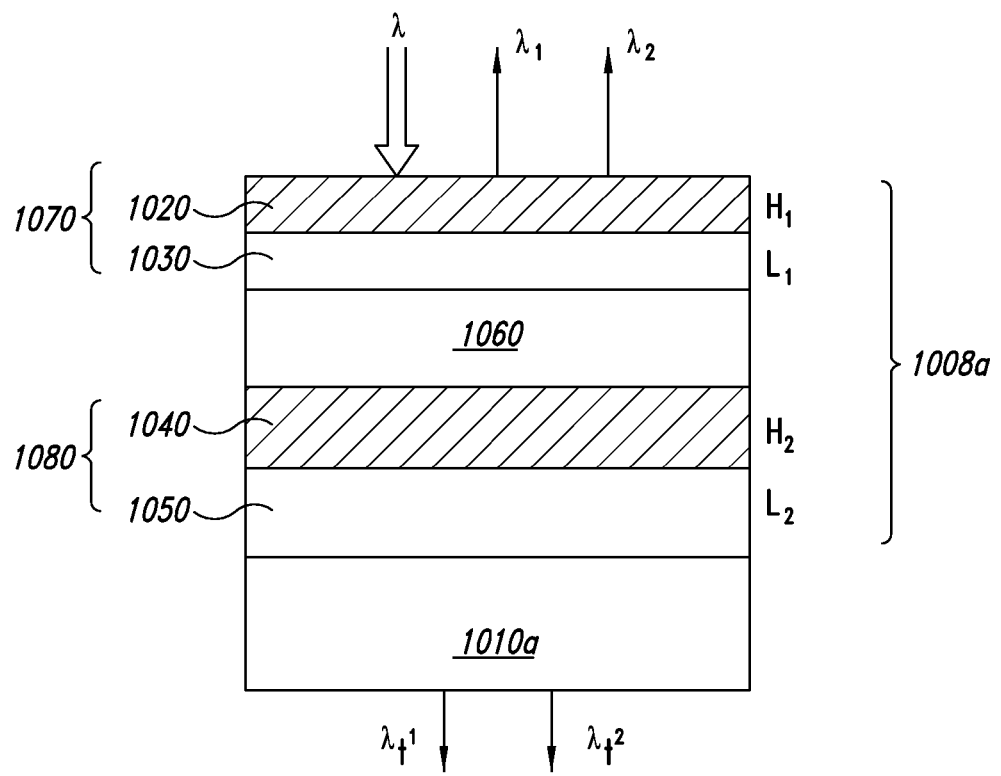
FIG. 10C is a side view of a reflective filter in a thin film stack construction according to one illustrated embodiment.

FIG. 10C shows the structure of a reflective filter according to one illustrated embodiment. Although the reflective filter of 1008a of FIG. 10A is referenced, it should be understood that the same structure is suitable for any one of the double-notch reflective filter (e.g., 108, 408, 508, etc) of the present disclosure.

The reflective filter relies on optical destructive interference to selectively reflect certain wavelength of light while transmitting others. For instance, light impinges upon any interface where there is a change in the index of refraction from one material to another; some of the incident light will be reflected. In addition, at the interface where the light traverses from a material of relatively high index of refraction to one having a lower index of refraction, a phase change of 180 degrees occurs in the reflected light. Thus by properly selecting layer thickness, destructive cancellation of the incident light at consecutive interfaces is achieved. Consequently, the more interfaces an incident light beam traverses, the greater the amount of the incident light is reflected. Thus, if enough layers are incorporated, substantially all the light of a particular wavelength can be filtered out before reaching the substrate. Reflective filters built on interference typically have sharp transmission slopes, which result in steep cut-on and cut-off transition boundaries (FIG. 2A) that are suitable for notch bands.

As shown, reflective filter 1008a is a thin-film stack formed on a substrate, i.e., the optical element 1010a. The reflective filter 1008a comprises two thin film stacks: stacks 1070 and 1080 that are optically coupled by a spacer 1060. More specifically, the first stack 1070 comprises a first series of discrete layers of materials. The material of each layer is selected, such that there is a change in the index of refraction at each interface, i.e., the index of refraction alternates from a higher value ($H_1$) to a lower value ($L_1$) or vice versa at each layer interface. Although only one layer $H_1$ and one layer of $L_1$ are shown, it is noted that additional alternating layers of $H_1$ and $L_1$ may be used. In particular, as the number of layers increases, a greater amount of incident light can be reflected. The thickness of each layer may be selected at a quarter of the wavelength of (i.e., a quarter wave stack) the first undesirable light ($\lambda_1$) to be reflected. Desirable wavelengths, including wavelength shifted from $\lambda_1$, are transmitted (e.g., $\lambda_t^1$).

Similar to the first stack, the second stack 1080 comprises a second series of discrete layers of material. The material of each layer is selected, such that there is a change in the index of refraction at each interface, i.e., the index of refraction alternates from a higher value ($H_2$) to a lower value ($L_2$) or vice versa at each layer interface. The materials of the second stack may be the same or different from those of the first stack. The thickness of the each layer in the second stack may be selected at a quarter of the wavelength of the second light ($\lambda_2$) to be reflected. Desirable wavelengths, including wavelength shifted from $\lambda_2$, are transmitted (e.g., $\lambda_t^2$).

The first stack 1070 is optically coupled to a second stack 1080 by a spacer 1060. The spacer may have, for example, a thickness that is even multiples of the quarter wavelengths (e.g., half wavelength) in order to transmit light into the dielectric layers of the second stack.

Dielectric materials with high refractive indices are those with refractive indices higher than 1.8, or more typically, higher than 2.0. Exemplary materials for $H_1$ or $H_2$ include metal oxide (e.g., titanium oxide, zinc oxide), metal sulfide (e.g., zinc sulfide), or silicon.

Dielectric materials with low refractive indices are those with refractive indices of less than 1.8, or more typically, less than 1.6. Exemplary materials for $L_1$ or $L_2$ include salts such as magnesium fluoride, sodium aluminum fluoride (cryolite) and the like.

The dielectric materials are typically formed by thin film deposition on a substrate in a controlled manner to control the thickness of each layer. Such methods includes, without limitation, vacuum deposition or chemical vapor deposition. As described herein, the thickness of the each layer may be selected as a quarter wavelength of the light to be reflected. More generally, the thickness of each layer can be selected empirically to achieve a certain criteria of optical performance, including the center wavelength and wavelength width of the reflected light.

The substrate can be an optical element in the lighting device, as described herein. For example, the optical element may be convex and positioned directly above a set of LEDs for shaping the exit beam of the lighting device.

Figure 10E:
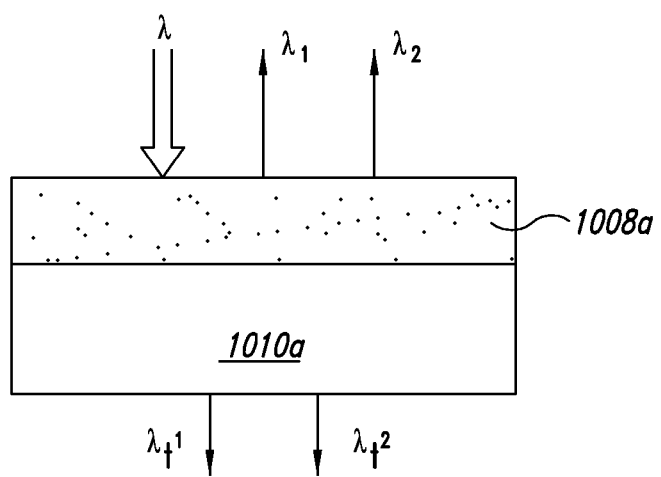
FIG. 10E is a side view of a rugate reflective filter in a single layer construction according to one illustrate embodiment.
Figure 10D:
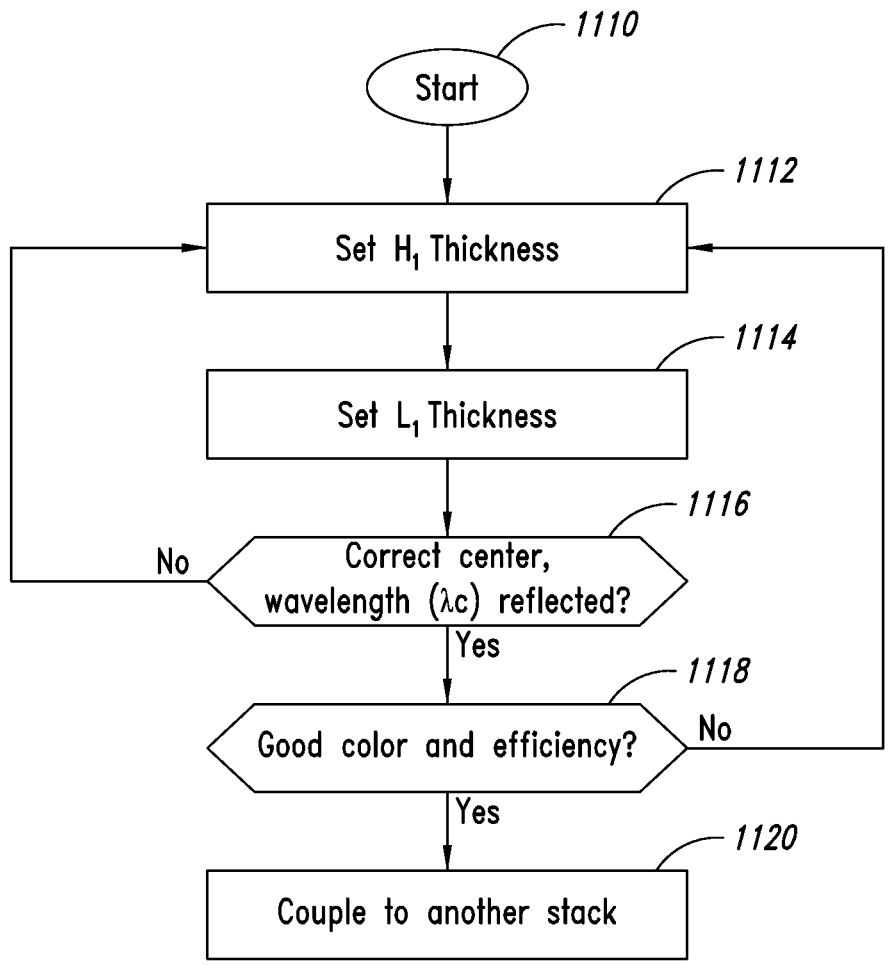
FIG. 10D is a flow diagram of a method for producing a thin film reflective filter according to one illustrated embodiment.

FIG. 10D shows a flow chart a method of designing and producing a thin film reflective filter in a thin film stack construction. At step 1100, materials of the high refractive indices ($H_1$ or $H_2$) and low refractive indices ($L_1$ or $L_2$) are chosen. At 1112, the thickness of the dielectric layers of the first high refractive index ($H_1$) is deposited. At 1114, the thickness of dielectric layers of the first high refractive index ($H_1$) is deposited. These two acts may be repeated to achieve a stack of alternating layers of $H_1$ and $L_1$. It is next determined at 1116 if the center transmission wavelength ($\lambda_c^1$) is at a desired wavelength. If not, the acts of 1112 and 1114 are repeated to select another thickness for the dielectric layers. Otherwise, it is determined at step 1118 whether the transmission efficiency and the spectral profile (e.g., bandwidth and the shape of the transmission window) meet pre-determined criteria. If not, the steps 1112 and 1114 are repeated. The above process may be iterated according to programmable algorithm until the transmission or reflection meets the desired criteria. The first stack can then be coupled to a second stack prepared by a similar method (step 1120).

In an alternative embodiment, shown in FIG. 10E, rather than a thin film stack construction, the reflective filter 1008*a* may take the form of a single layer construction, in which the refractive indices vary throughout the thickness of the single layer. Such a reflective filter is also referred to as a rugate filter. Rugate filters can be provided by continuously depositing a dielectric material having continuous gradations in the stroichiometric compositions and refractive indices as a function of thickness of the dielectric material.

Figure 11:
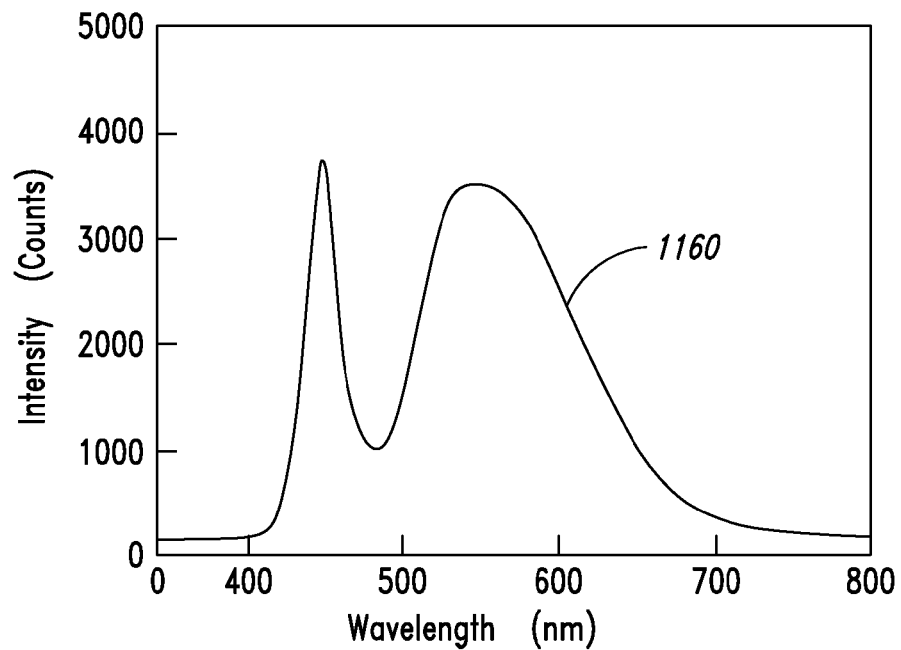
FIG. 11 is a graph of a spectrum light emitted by a white LED unmodified by the teachings of this disclosure.

FIG. 11 shows an unmodified optical spectrum 1160 produced by a Cree XME cool white LED in an Evluma Clearlight solid state lamp. Between 400 nm and 500 nm a high blue spike is evident and has an amplitude that exceeds the more desirable mid-spectrum peak.

Figure 12:
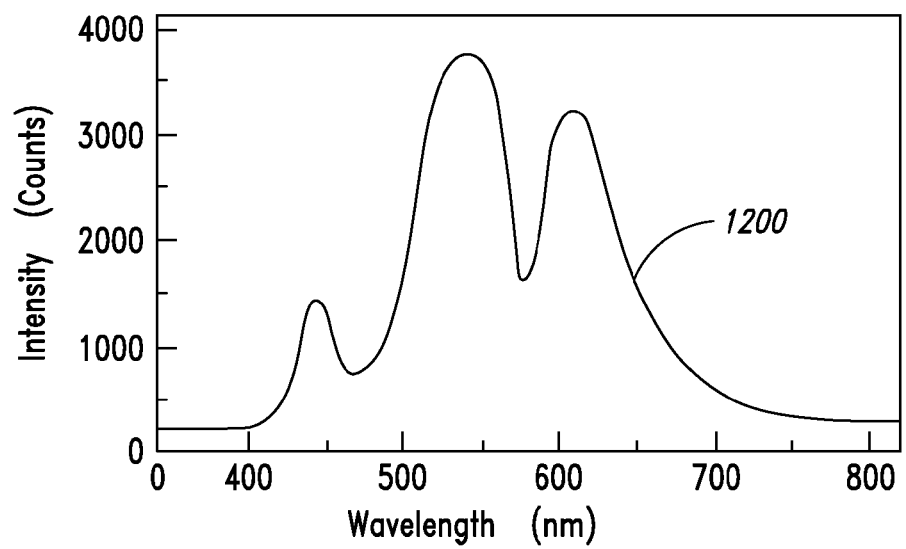
FIG. 12 is a graph of a spectrum of light emitted by a lighting device of the embodiment of FIGS. 2B-6.

FIG. 12 shows a spectrum 1200 produced by a Cree XME cool white LED used in a lighting device that includes a reflective filter, wavelength shifter and back reflector with a red emitting phosphor, similar to that illustrated in FIGS. 2B-4. In particular, the optical spectrum 1200 is an expected result of using a double-notch reflective filter installed on a flat (non-lens) optical element of a lighting device. Comparing FIGS. 11 and 12, it can be seen that the use of a double-notch reflective filter and wavelength shifting can diminish the blue spike of the LED as well as the dull yellow light, while provide a power gain in the mid-wavelength range of approximately 17% due to re-emitted light in the desirable regions (e.g., red wavelengths). The optical element may be convex and positioned directly above a set of LEDs for shaping the exit beam of the lighting device. Coating concave surfaces with a reflective filter increases the effectiveness of the lighting device by reflecting more of the short wavelength light onto a wavelength shifter, such as a phosphor coated over an LED.

The various embodiments described herein may allow the use of a cool white (6000K CCT) LEDs or other active light source in a lighting device to produce a much lower CCT light. Cool white LEDs are typically much less expensive than lower CCT LEDs because cool white LEDs use a simpler phosphor compound. Cool white LEDs have also been shown to have better color temperature maintenance over the life of the LED.

Another possible advantage of the various embodiments described herein is that the low CCT light is more closely related to a Plankian (blackbody) radiator (such as an incandescent lamp filament) than the currently available low CCT LEDs. That is, the slope of the short wavelength light is monotonically increasing in the spectrum of the disclosed embodiments, without a sharp blue light wavelength spike. This allows lighting designers to use calculations based on incandescent lamp performance specifications with more confidence than previous low CCT LEDs.

Figure 13:
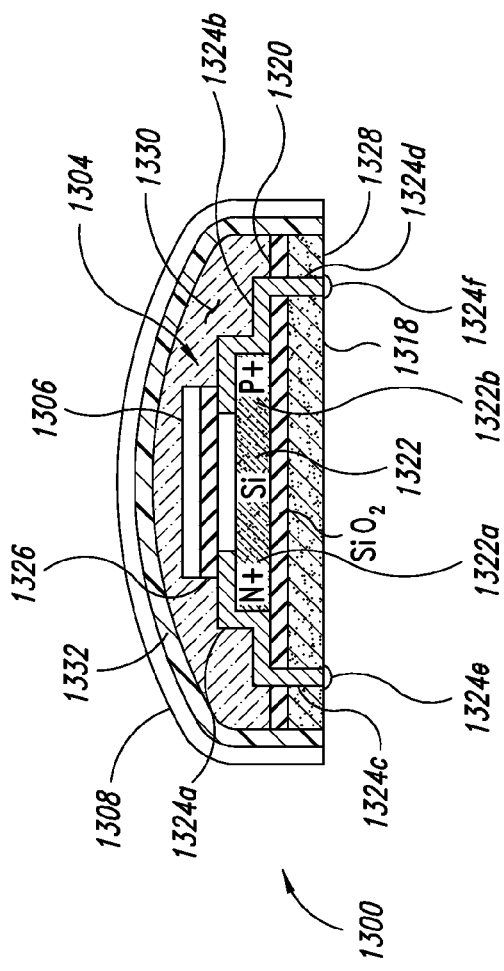
FIG. 13 is a cross-sectional view of an LED package according to one illustrated embodiment, including a reflective filter on an exterior of a cover that covers an LED structure, and enclosing an encapsulant.

FIG. 13 shows an LED package 1300, according to one illustrated embodiment.

The LED package 1300 may include an LED structure 1304, a wavelength shifter 1306 and a reflective filter (e.g., dichroic) 1308. The wavelength shifter (e.g., phosphor(s)) 1306 is positioned between the LED structure 1304 and the reflective filter 1308. The reflective filter 1308 may pass certain wavelengths of light, while reflecting other wavelengths. The wavelength shifter 1306 may shift one or more wavelengths of light emitted by the LED structure 1304 or reflected by the reflective filter 1308, to some desired wavelength(s).

The LED structure 1304 can take any of the large variety of forms used in manufacturing LEDs. For example, the LED structure 1304 may be formed on a substrate 1318, for instance a sapphire substrate, silicon substrate, or silicon carbide substrate. The substrate 1318 may carry an electrical insulation layer 1320, for instance a layer of silicon dioxide or other passivation layer. The LED structure 1304 may include a one or more layers of semiconductor materials 1322, portions 1322*a*, 1322*b* of which may be doped appropriately ($N^+$, $P^+$) to form a p-n junction. Electrically conductive leads or traces 1324*a*, 1324*b* (collectively 1324) may be coupled to respective portions of the p-n junction. An electrical insulation layer 1326 may overlie a portion of the silicon 1322 including the p-n junction. The electrically conductive leads or traces 1324 may extend as vias 1324c, 1324d through throughholes to provide contacts 1324e, 1324f one an exterior surface 1328 of the substrate 1318. Such may allow convenient surface mounting of the LED package 1300.

Suitable semiconductor materials (i.e., phosphors) may include: gallium arsenide (GaAs), aluminum gallium arsenide (AlGaAs), gallium arsenide phosphide (GaAsP), gallium arsenide indium phosphide (GaAsInP), gallium (III) phosphide (GaP), aluminum gallium indium phosphide (AlGaInP), indium gallium nitride (InGaN)/gallium (III) nitride (GaN), aluminum gallium phosphide (AlGaP), and/or zinc selenide (ZnSe). The selection of particular materials may be governed by the desired wavelength of the output.

The LED package 1300 may include an encapsulant 1330 overlying the LED structure 1304 and/or other components. The encapsulant 1330 may take a variety of forms and may serve a variety of functions. For example, the encapsulant 1330 may take the form of an encapsulating gel. An encapsulating gel may, for instance provide for index matching. An encapsulating gel may additionally, or alternatively, provide a buffer capable of handling heat generated by the LED structure 1304 or accommodating changes produced by such heat. For instance, an encapsulating silicone gel may accommodate changes in size or volume caused by heating and cooling cycles. The encapsulating gel may also provide some environmental protection to the LED structure and/or other structures.

The LED package 1300 may include a cover or optic 1332 which provides environmental protection to the LED structure 1304 and/or other components. The cover or optic 1332 may take a variety of forms for example, a plastic or glass cover. The cover or optic 1332 may be transparent or translucent to at least some wavelength(s) of light. The reflective filter 1308 may be carried by the cover or optic 1332. For example, the reflective filter 1308 may be deposited via appropriate techniques (e.g., vapor disposition) on an exterior surface of the cover or optic 1308, for instance as illustrated in FIG. 13.

The LED package 1300 may be formed as an integral or one piece or unitary unit, and may be sold or distributed as such. While illustrated as a surface mount package, the LED package 1300 can be formed more traditional packages having domed, cylindrical or flat covers.

The reflective filter 1308 in combination with the wavelength shifter 1306 may advantageously produce more of a light of a desired set of wavelengths for a given amount of power than could otherwise be obtained from an LED package 1300. The reflective filter 1308, with or without the wavelength shifter 1306, may advantageously produce a very narrow band of emission from the LED package 1300, more narrow than could otherwise be obtained from an LED package 1300. Such may narrow the wavelength band even where an LED 1304 with a relatively narrow bandwidth is employed. Such may, for instance, be advantageous where the wavelengths emitted by the LED vary with some characteristic such as temperature, applied current or applied voltage. For instance, such may be used to achieve a desired emission in the amber wavelengths, even where the LED package 1300 is subjected to large variations in temperature. Such could also be used to allow non-white LEDs which use phosphors to convert blue to another narrow band, such as phosphor amber. Simply applying a reflective coating to an optic of an LED package may be used to filter out undesirable wavelengths, change the color temperature, using existing wavelength converter (e.g., phosphor) of the LED package. It is noted that if the phosphor coating is made sufficiently thick or dense to convert all of the light emitted by the LED into a desired wavelength(s), the outer particles of phosphor will redirect or diffuse the desire wavelength(s) backwards, where the light may be reabsorbed, reducing efficiency.

Figure 14:
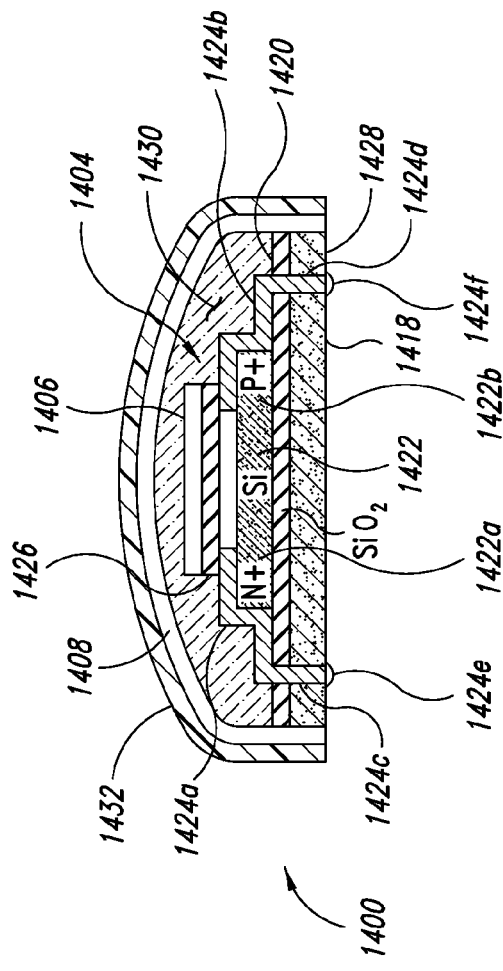
FIG. 14 is a cross-sectional view of an LED package according to one illustrated embodiment, including a reflective filter on an interior of a cover that covers an LED structure, and enclosing an encapsulant.

FIG. 14 shows an LED package 1400, according to one illustrated embodiment.

The LED package 1400 is similar or even identical in some respects to the LED package 1300 (FIG. 13). Thus, similar or identical structures are identified with reference numbers that share the same two least significant digits as the reference numbers from the embodiment of FIG. 13. Only significant difference in structure and operation are discussed below.

In contrast to the LED package 1300, the LED package 1400 has the reflective filter 1408 positioned on the interior of the cover 1432. For example, the reflective filter 1408 may be deposited on an interior surface of the cover 1432 using suitable deposition techniques. Such may advantageously provide environmental protection for the reflective filter 1308.

Again, the LED package 1400 may be formed as an integral or one piece or unitary unit, and may be sold or distributed as such. While illustrated as a surface mount package, the LED package 1400 can be formed more traditional packages having domed, cylindrical or flat covers.

Figure 15:
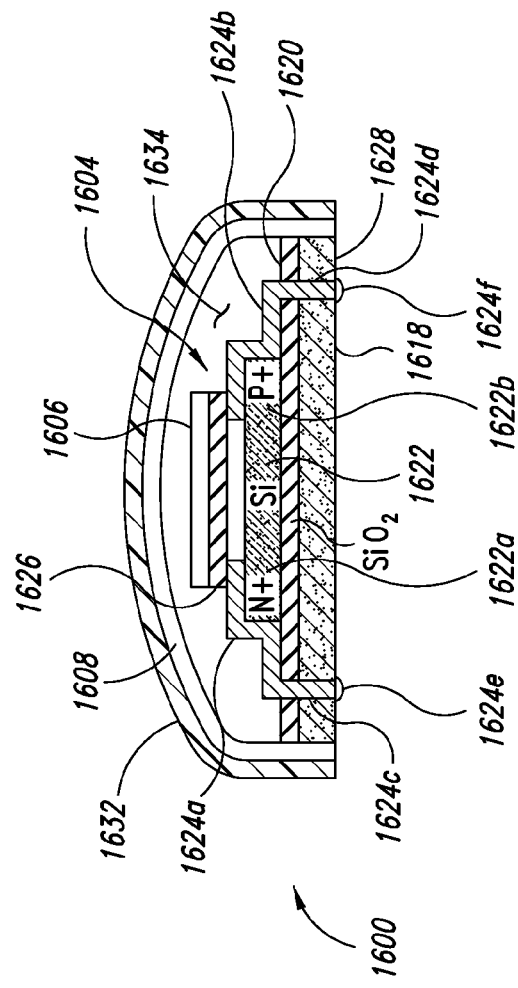
FIG. 15 is a cross-sectional view of an LED package according to one illustrated embodiment, including a reflective filter on an exterior of a cover that covers an LED structure, and enclosing an encapsulant which includes a wavelength shifter.

FIG. 15 shows an LED package 1500, according to one illustrated embodiment.

The LED package 1500 is similar or even identical in some respects to the LED package 1300 (FIG. 13). Thus, similar or identical structures are identified with reference numbers that share the same two least significant digits as the reference numbers from the embodiment of FIG. 13. Only significant difference in structure and operation are discussed below.

In contrast to the LED package 1300, the LED package 1500 has the wavelength shifter 1506 incorporated into the encapsulant (e.g., silicone gel encapsulant), for example forming an integral part thereof. Such may advantageously allow a reduction in the height of the LED package 1500.

The silicone gel encapsulant 1530 may overlie directly or indirectly the at least one light emitting diode structure 1506. The reflective filter 1508 may be carried directly or indirectly by the silicone gel encapsulant 1530.

Again, the LED package 1500 may be formed as an integral or one piece or unitary unit, and may be sold or distributed as such. While illustrated as a surface mount package, the LED package 1500 can be formed more traditional packages having domed, cylindrical or flat covers. Alternatively, such may completely omit a cover, relying solely on the encapsulant 1530 for environmental protection.

Figure 16:
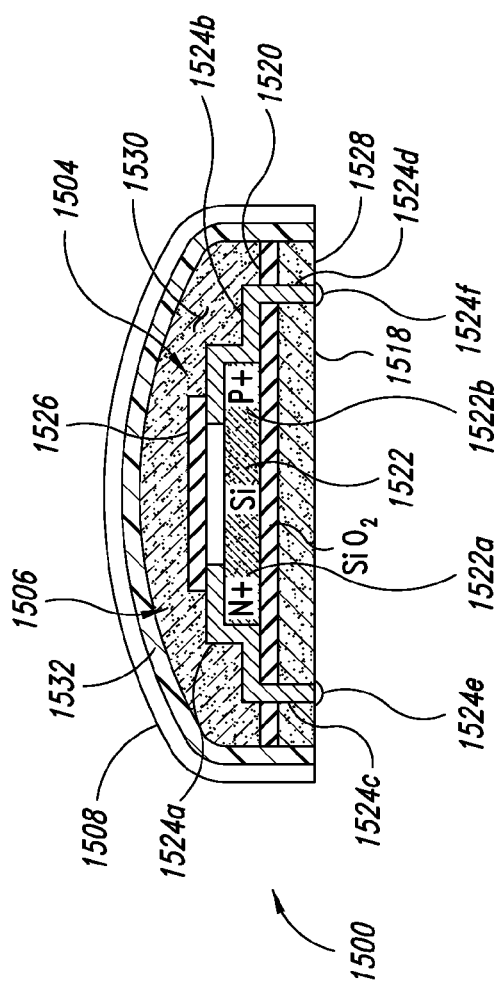
FIG. 16 is a cross-sectional view of an LED package according to one illustrated embodiment, including a reflective filter on an exterior of a cover that covers an LED structure without an encapsulant.

FIG. 16 shows an LED package 1600, according to one illustrated embodiment.

The LED package 1600 is similar or even identical in some respects to the LED package 1400 (FIG. 14). Thus, similar or identical structures are identified with reference numbers that share the same two least significant digits as the reference numbers of the embodiment of FIG. 14. Only significant difference in structure and operation are discussed below.

Similar to the LED package 1400, the LED package 1600 has the reflective filter 1608 positioned on the interior of the cover 1632. For example, the reflective filter 1608 may be deposited as one or more layers of a choric material on an interior surface of the cover 1632 using suitable deposition techniques. Such may advantageously provide environmental protection for the reflective filter 1608. In contrast to the LED package 1400, the LED package 1600 may optionally omit the encapsulant 1430. The LED package 1600 may employ either air or a vacuum 1634 in place of the encapsulant 1430.

Alternatively, the cover 1632 may be positioned directly on the wavelength shifter 1606 or LED structure 1604.

Again, the LED package 1600 may be formed as an integral or one piece or unitary unit, and may be sold or distributed as such. While illustrated as a surface mount package, the LED package 1600 can be formed more traditional packages having domed, cylindrical or flat covers.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A lighting device, comprising:
an active light source operable to emit light across a plurality of wavelengths;
at least one double-notch reflective filter that substantially passes light of a first set of wavelengths in the plurality of wavelengths and that substantially reflects light of a second set of wavelengths in the plurality of wavelengths, the second set of wavelengths including a first rejection band of about 400 nm to 480 nm and a second rejection band of about 570 nm to 600 nm, the at least one double-notch reflective filter positioned in an optical path between the active light source and an exterior of the lighting device to filter the light before the light reaches the exterior of the lighting device; and
a wavelength shifter positioned and oriented to receive at least some of the light of the second set of wavelengths returned from the at least one double-notch reflective filter and in response emit light at wavelengths shifted from respective first rejection band and the second rejection band toward an optical exit of the lighting device.

2. The lighting device of claim 1 wherein the active light source comprises at least one solid state light source.

3. The lighting device of claim 1 wherein the active light source comprises at least one light emitting diode.

4. The lighting device of claim 3 wherein the wavelength shifter comprising at least one phosphor material.

5. The lighting device of claim 4 wherein the at least one phosphor material is a one-piece unitary structure with the light emitting diode.

6. The lighting device of claim 1 wherein the at least one double-notch reflective filter comprises an optical element and a stack of discrete alternating layers of dielectric materials, wherein the stack comprises a first stack, a second stack and an optical spacer coupling the first and the second stacks, and wherein the first stack comprises alternating layers of a first dielectric material of a first refractive index and a second dielectric material of a second refractive index, and the second stack comprises alternating layers of a third dielectric material of a third refractive index and a fourth dielectric material of a fourth refractive index.

7. The lighting device of claim 6 wherein the layers of the first dielectric material and the third dielectric material are identical and are of different thicknesses.

8. The device of claim 6 wherein the layers of the second dielectric material and the fourth dielectric material are identical and are of different thicknesses.

9. The lighting device of claim 6 wherein each layer of the first dielectric material and the second dielectric material is a quarter of a wavelength selected from the range of 400 nm and 480 nm, and each layer of the third dielectric material and the fourth dielectric material is a quarter of a wavelength selected from the range of 570 nm to 600 nm.

10. The lighting device of claim 6 wherein the optical element is at least part of the optical exit of the lighting device.

11. The lighting device of claim 1 wherein the at least one double-notch reflective filter comprises an optical element and a single layer rugate filter configured to reflect one or more wavelengths selected from the range of 400 nm to 480 nm and one or more wavelengths selected in the range of 570 nm to 600 nm.

12. The lighting device of claim 1 wherein the lighting device is a light emitting diode package, the active light source is at least one light emitting diode, the wave length shifter is at least one phosphor material that is a one-piece unitary structure with the at least one light emitting diode, and the reflective filter is a one piece unitary structure of the diode light emitting diode package.

13. The lighting device of claim 12, further comprising:
a cover overlying the at least one light emitting diode and the at least one phosphor material.

14. The lighting device of claim 13 wherein the reflective filter is carried on a surface, within or by the cover.

15. The lighting device of claim 13, further comprising:
a silicone gel encapsulant received between the cover and the at least one light emitting diode.

16. The lighting device of claim 1 wherein the wavelength shifter comprises at least one phosphor material.

17. The lighting device of claim 16 wherein the at least one phosphor material is carried by the active light source.

18. The lighting device of claim 16 wherein the at least one phosphor material is positioned between the active light source and the optical exit of the lighting device.

19. The lighting device of claim 16 wherein at least a portion of the active light source is positioned between the at least one phosphor material and the optical exit of the lighting device.

20. The lighting device of claim 1 wherein the wavelength shifter comprises at least two phosphor materials arranged in a pattern, the at least two phosphor materials having different properties from one another.

21. The lighting device of claim 1 wherein the wavelength shifter comprises at least two phosphor materials arranged in a repeating pattern, the at least two phosphor materials having different properties from one another.

22. The lighting device of claim 1 wherein the first set of wavelengths includes wavelengths above approximately 480 nanometers and wavelengths above approximately 600 nm.

23. A light emitting diode package, comprising:
a substrate;
at least one light emitting diode carried by the substrate;
at least one double-notch reflective filter positioned with respect to the light emitting diode to substantially pass light of a first set of wavelengths in the plurality of wavelengths and substantially return light of a second set of wavelengths in the plurality of wavelengths, wherein the second set of wavelengths includes a first rejection band having a bandwidth of 400 nm to 480 nm with a first center wavelength ($\lambda_c^1$) at about 450 nm and a second rejection band having a bandwidth of 570 nm to 600 nm with a second center wavelength ($\lambda_c^2$) at about 585 nm; and
at least one wavelength shifter positioned with respect to the at least one light emitting diode and the at least one double-notch reflective filter, the at least one wavelength shifter is configured to receive at least some of the light emitted by the at least one light emitting diode and to receive at least some of the second set of wavelengths reflected from the at least one double-notch reflective filter and in response emit light at wavelengths shifted from the respective first rejection band and the second rejection band.

24. The light emitting diode package of claim 23 wherein the wave length shifter and the at least one light emitting diode form a single-piece unitary structure.

25. The light emitting diode package of claim 24 wherein the wavelength shifter is deposited over the at least one light emitting diode.

26. The lighting device of claim 23, further comprising:
a cover overlying the at least one light emitting diode.

27. The lighting device of claim 26 wherein the double-notch reflective filter is carried by the cover.

28. The lighting device of claim 26 wherein the double-notch reflective filter is deposited on a surface of the cover.

29. The lighting device of claim 26, further comprising:
a silicone gel encapsulant received between the cover and the at least one light emitting diode.

30. The lighting device of claim 26, further comprising:
a gap between the cover and the at least one light emitting diode.

31. The lighting device of claim 23, further comprising:
a silicone gel encapsulant overlying the at least one light emitting diode.

32. The lighting device of claim 31 wherein the wavelength shifter is incorporated into the silicone gel encapsulant.

33. The lighting device of claim 31 wherein the double-notch reflective filter is carried directly by the silicone gel encapsulant.

* * * * *